United States Patent [19]

Kashiwagi

[11] Patent Number: 4,992,708
[45] Date of Patent: Feb. 12, 1991

[54] HORIZONTAL DEFLECTION AND HIGH VOLTAGE GENERATING CIRCUIT

[75] Inventor: Shigeru Kashiwagi, Noda, Japan

[73] Assignee: Victor Company of Japan, Ltd., Japan

[21] Appl. No.: 455,064

[22] Filed: Dec. 22, 1989

[30] Foreign Application Priority Data

Dec. 22, 1988 [JP] Japan .................................. 63-322144
Jan. 11, 1989 [JP] Japan ...................................... 1-3932
Jan. 25, 1989 [JP] Japan .................................... 1-15937

[51] Int. Cl.$^5$ ............................................. H01J 29/70
[52] U.S. Cl. .................................................. 315/411
[58] Field of Search ................................. 315/408, 411

[56] References Cited

U.S. PATENT DOCUMENTS 4,442,384  4/1984  Maekawa et al. .................... 315/399

Primary Examiner—Theodore M. Blum
Attorney, Agent, or Firm—Lowe, Price, LeBlanc, Becker & Shur

[57] ABSTRACT

A horizontal deflection and high voltage generating circuit having a horizontal oscillating circuit, a horizontal excitation circuit responsive to an oscillating pulse outputted from the horizontal oscillating circuit, a horizontal output circuit excited by an output of the horizontal excitation circuit, a high voltage output circuit responsive to an oscillating pulse outputted from the horizontal oscillating circuit, which comprises a delay circuit for causing a lag to a leading edge of the oscillating pulse applied from the horizontal oscillating circuit to the horizontal excitation circuit with respect to a leading edge of the oscillating pulse applied from the horizontal oscillating pulse to the high voltage output circuit, the lag being a predetermined delay time, the value of which is set in such a manner that a trailing edge of a horizontal deflection pulse generated by the horizontal output circuit is substantially in agreement with a trailing edge of a high voltage pulse, which is generated by the high voltage output circuit and has a pulse duration larger than a pulse duration of the horizontal deflection pulse generated by the horizontal output circuit.

8 Claims, 12 Drawing Sheets

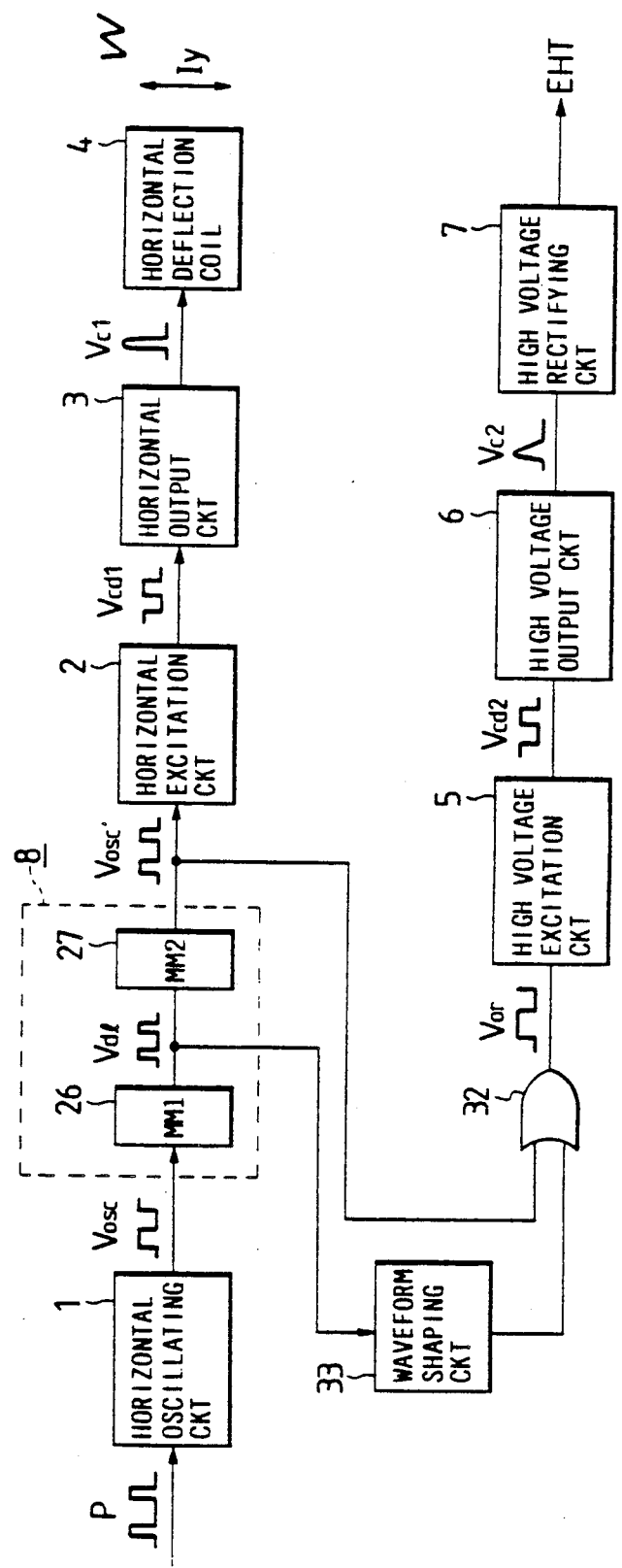

4,992,708

HORIZONTAL DEFLECTION AND HIGH VOLTAGE GENERATING CIRCUIT

BACKGROUND OF THE INVENTION

1. Field of the Invention

This invention relates to an improved horizontal deflection and high voltage generating circuit for use in a television receiver or a displaying apparatus using a picture tube.

2. Description of the Prior Art

FIG. 5(A) is a schematic block diagram for showing the construction of the main part of an example of a conventional horizontal deflection and high voltage generating circuit. In this figure, reference numeral 1 denotes a horizontal oscillating circuit for outputting a horizontal oscillating pulse $V_{osc}$ which is in synchronization with a horizontal synchronization signal pulse P sent from a pre-stage (not shown).

Further, reference numeral 2 indicates a horizontal excitation circuit; 3 a horizontal output circuit; 4 a horizontal deflection coil; 5 a high voltage excitation circuit; 6 a high voltage outputting circuit; and 7 a high voltage rectifying circuit.

In such a configuration, in accordance with a well known principle, a horizontal deflection pulse $V_{c1}$ is generated in the horizontal outputting circuit 3, and on the other hand, a sawtooth current (a horizontal deflection current) $I_y$ having a horizontal deflection period, which is in synchronization with a horizontal synchronization signal pulse P, flows through the horizontal deflection coil 4 which is provided at the neck portion of a picture tube (not shown) and deflects an electron beam of the picture tube from side to side.

On the other hand, in the high voltage outputting circuit 6, there is similarly generated a high voltage pulse $V_{c2'}$ which is added to a voltage and rectified by a high voltage rectifying circuit 7 to provide a direct current high voltage EHT which is then supplied to an anode electrode of the picture tube.

Incidentally, part of the horizontal deflection pulse $V_{c1}$ is fed back to the horizontal oscillating circuit 1, and thus an automatic frequency control (AFC) circuit is formed to control the oscillating phase of the horizontal oscillating circuit 1 so that the phase of the horizontal deflection current $I_y$ is properly in agreement with that of the horizontal synchronization signal pulse P.

FIG. 6 is a circuit diagram for showing details of the construction of part of the circuit of FIG. 5(a). In this figure, reference numeral 9 denotes a horizontal excitation NPN transistor; and 10 a base input resistance of the transistor 9 to which the above described horizontal oscillating pulse $V_{osc}$ is applied.

To the collector of the horizontal excitation transistor 9, a dc voltage +E is supplied by a primary winding 11a of the horizontal excitation transformer 11, and a rectangular horizontal excitation pulse $V_{cd1}$ having a phase opposite to the phase of the horizontal oscillating pulse $V_{osc}$ is generated therein. The voltage represented by this horizontal excitation pulse $V_{cd1}$ is changed by a secondary winding 11b of the horizontal excitation transformer 11. Further, the resultant voltage is applied between the base and the emitter of a horizontal output NPN transistor 12 provided within the horizontal output circuit 3.

In such a configuration, the horizontal output NPN transistor 12 effects a switching operation in cooperation with a damping diode 13. Then, in accordance with a well known principle, a horizontal deflection pulse $V_{c1'}$ which is a sinusoidal half-wave, is generated in the collector of the horizontal output transistor 12 so that the horizontal deflection current $I_{y'}$ which is a sawtooth wave, flows through the horizontal deflection coil 4. Further, the oscillation period of the half-wave sinusoid, that is, the horizontal deflection pulse $V_{c1'}$ is determined mainly by the inductance of the horizontal deflection coil 4 and the capacity of a blanking resonance capacitance 14.

Furthermore, reference numeral 15 denotes a horizontal output transformer having a primary winding 15a, by which the dc power +E is supplied to the circuit, and a secondary winding 15b, by which the voltage represented by the horizontal deflection pulse $V_{c1'}$ is appropriately changed. The horizontal output transformer 15 supplies pulses to each portion of the instrument including the above described AFC loop. Moreover, reference numeral 16 designates an S-shaped correction capacitor which also serves to prevent the flow of a dc component of the current.

FIG. 7 is a circuit diagram for showing further details of the construction of the circuits of a high voltage generating portion. In this figure, reference numeral 17 designates a high voltage excitation NPN transistor; 18 a base resistance: 19 a high voltage excitation transformer; 19a a primary winding of the transformer 19; and 19b a secondary winding of the transformer 19. Further, reference numeral 20 indicates a high voltage output NPN transistor; 21 a damper diode; 22 a blanking resonance capacitor: 23 a dummy coil: 24 a flyback transformer; and 25 a high voltage rectifying diode.

An operating principle of the circuit of FIG. 7 is substantially the same as the operating principle of the circuit of FIG. 6. Similarly as in case of the circuit of FIG. 6, when the horizontal excitation pulse $V_{osc}$ is applied to one end of the base resistance 18, a high voltage excitation pulse $V_{cd2}$ occurs at the collector of the high voltage transistor 17 and on the other hand a high voltage pulse $V_{c2'}$ which is a sinusoidal half-wave, occurs at the collector of the high voltage output transistor 20. Further, by feeding this high voltage pulse $V_{c2}$ to a primary winding 24a of the flyback transformer 24, a high voltage pulse $V_{hv}$ is obtained by the secondary winding thereof. Moreover, the high voltage pulse $V_{hv}$ is rectified by a high voltage rectifying diode 25 and as a result a dc high voltage EHT is obtained.

Furthermore, the dummy coil 23 is used to store the reactive power sufficient to stably derive the dc high voltage EHT therefrom by floating a sawtooth current therethrough and can be omitted according to the design of the flyback transformer 24.

Further, it is desirable in view of enlargement of the range in which a picture can be effectively used, that a pulse duration of a horizontal deflection pulse (a horizontal blanking pulse), that is, a blanking interval $t_{r1}$ is as short as possible. Despite a problem that the loss of the horizontal output transistor 12 increases if the blanking interval $t_{r1}$ is shortened, it is necessary to make the blanking interval equal to or less than at least 20% of the horizontal deflection interval $t_h$.

On the other hand, in order to improve the regulation of the dc high voltage EHT, it is preferable that a pulse duration $t_{r2}$ of the high voltage pulse $V_{c2}$ at a high voltage generating portion is as long as possible. In that case, there is an advantage that the loss of the high voltage output transistor 20 can be reduced.

FIG. 8(A) shows the waveform at each portion in case where the pulse duration $t_{r2}$ of the high voltage pulse $V_{c2}$ at the side of the high voltage generating portion is reduced to 40% of the horizontal deflection interval $t_h$.

First, when the horizontal oscillating pulse $V_{osc}$ as shown in FIG. 8(A)(1) is applied to the horizontal excitation transistor 9, the horizontal excitation pulse $V_{cd1'}$ which is a rectangular wave having a phase opposite to a phase of the horizontal oscillating pulse $V_{osc}$ (1) is generated at the collector of the transistor 9 as shown in FIG. 8(A)(2). An interval required for the low level of the horizontal excitation pulse $V_{cd1}$ is extended due to storage time effects of the horizontal excitation transistor 9 and is longer than the pulse duration $t_{osc}$ by a storage time $t_{sd}$.

Then, the base current $I_{b1}$ of the horizontal output transistor 12 flows towards the positive direction when the value of the horizontal excitation pulse $V_{cd1}$ is positive, as shown in FIG. 8(A)(3), and is immediately decreased to a negative value when the horizontal excitation pulse $V_{cd1}$ is bottomed to its low level, and further returns to the level of zero after a storage time $t_{s1}$ of the horizontal output transistor 12 passes.

When the storage time $t_{s1}$ elapses, the state of the horizontal output transistor 12 is changed from an on-state to an off-state. Simultaneously with this, the horizontal deflection pulse $V_{c1'}$ which is a sinusoidal half-wave as shown in FIG. 8(A)(4), is generated at the collector of the transistor 12. The period of this half-wave sinusoid, that is, the horizontal deflection pulse $V_{c1}$ is determined by the resonance of the flyback resonance capacitor 14 and the horizontal deflection coil 4. Further, when the blanking interval $t_{r1'}$ up to the time at which the current $I_{b1}$ reaches the level of zero again, passes a damper current $I_{d'}$ automatically flows out as shown by a dashed line of FIG. 8(A)(5) and increases nearly linearly towards the positive direction and is smoothly connected to the graph of a collector current $I_{c1}$ shown by a line of FIG. (8)(5).

On the other hand, in the similar process, the base current $I_{b2}$ of the high voltage output transistor 20 in the high voltage generating portion first turns to the negative direction and then returns to the level of zero during the storage time $t_{s2}$ of the high voltage output transistor 20 as shown in FIG. 8(A)(6). During the storage time $t_{s2'}$ the collector current $I_2$ continues flowing. Further, the current $I_{c2}$ becomes zero after the storage time $t_{s2}$ passes. At that time, the sinusoidal half-wave from the collector, that is, the high voltage pulses $Vc_2$ shown in FIG. 8(A)(7) start occurring.

Further, when the pulse duration $t_{r2}$ of this high voltage pulse $V_{c2}$ is elapsed, the damper current $I_{d2}$ automatically flows out as shown in FIG. 8(A)(8) which is connected to the graph of the collector current $I_{c2}$ of the high voltage output transistor 20. Thus, similarly as in case of the example of the current in a deflection portion of FIG. 8(A)(5), the current waveform which is obtained increases linearly.

Here, there occurs a problem concerning the rise time of the horizontal excitation pulse $V_{cd1}$ shown in FIG. 8(A)(2), that is, the time T when the base currents $I_{b1}$ and $I_{b2}$ of the output transistors shown in FIG. 8(A)(3) and (6) commence flowing out.

As is understood from FIG. 8(A), the time T is considerably influenced by the pulse duration $t_{osc}$ of the horizontal excitation pulse $V_{osc'}$ the storage time $t_{sd}$ of the horizontal excitation transistor 9 or the high voltage excitation transistor 17. Specifically, the storage time $t_{sd}$ varies widely between the excitation transistors 9 and 17 and is subjected to the influence of ambient temperature.

If the time T is changed by such influence and becomes subsequent to the time $T_o$ when the collector current $I_{c1}$ of FIG. 8(A)(5) crosses the zero level, the collector current $I_{c1}$ cannot flow out and the graphs of the currents cannot be smoothly connected to each other because the base current $I_{b1}$ of the horizontal output transistor 12 is zero even when the damper current $I_{d1}$ reaches the level of zero and thus cannot further flow. Further, it is well known that if the device enters such a state, a small pulse occurs in the neighborhood of the center of the horizontal deflection pulse (that is, a collector pulse) $V_{c1}$ of FIG. 8(A)(4), and the collector loss of the horizontal output transistor 12 suddenly increases along with the danger of being destroyed.

In FIG. 8(A)(5), the maximum value $I_{d1p}$ of the damper current $I_{d1}$ is drawn as being equal to that of the maximum value $I_{c1p}$ of the collector $I_{c1}$. However, this shows an ideal state of the device in which the circuit loss is zero. Practically, the resistance component of the circuit influences the power which is derived from the horizontal output transformer 15. Thus, as shown in FIG. 8(A)(5)', it is usual that the maximum value $I_{d1p'}$ of the damper current $I_{d1}$ is less than that $I_{c1p'}$ of the collector current $I_{c1}$.

Therefore, the time $T_o$, when the collector current $I_{c1}$ crosses the zero level is prior to the time $T_o$ of FIG. 8(A)(5). This means that the time T may be subsequent to the time $T_{o'}$. Thus, it is preferable that the time T is made further earlier.

However, on the other hand, as can be understood from FIG. 8(A)(6) and (8), even if the time T is made earlier, the base current $I_{b2}$ flows before the collector pulse (the high voltage pulse) $V_{c2}$ and in addition the collector current $I_{c2}$ flows out at the same time. Therefore, in this case, the collector loss suddenly increases, and the high voltage output transistor 20 is damaged. Referring specifically to the high voltage generating portion, when the current flowing through the load the dc high voltage EHT is increased along with the luminosity of the screen of the picture tube, the pulse duration $t_{r2}$ of the high voltage pulse $V_{c2}$ becomes longer, and thus the danger of increasing the collector loss and that of damage to the high voltage output transistor increase.

Such difficulty may occur where the horizontal deflection period $t_h$ is short (for example, in case of a high resolution display), that is, in case where the interval from the time T1 when the blanking time passes to the time $T_o$ when the collector current $I_{c1}$ becomes zero is short in comparison with the storage time of each of the above described parts.

Taking these into consideration, as can be seen from FIG. 8(A), the time T is a moment when the above described danger exists, in any case.

In order to resolve the foregoing problems, the pulse duration $t_{r2}$ of the high voltage pulse $V_{c2}$ should be as short as the pulse duration $t_{r1}$ of the horizontal deflection pulse $V_{c1}$.

However, if the pulse duration $t_{r2}$ of this high voltage pulse $V_{c2}$ is shortened, there occur problems in that the collector loss of the high voltage output transistor 20 increases and in that the regulation of the change of the load, to which the dc high voltage EHT is applied, is worsened and thus the performance is deteriorated.

Next, FIG. 5(B) is a schematic block diagram for showing the construction of a primary part of another conventional horizontal deflection and high voltage generating circuit (hereunder sometimes referred to as a second conventional horizontal deflection and high voltage generating circuit). In this figure, reference numerals 1 through 7 designate corresponding parts of FIG. 5(A). Further, reference numeral 8 denotes a leading edge delaying circuit for delaying the leading edge of the horizontal excitation pulse $V_{osc}$ outputted by the horizontal oscillating circuit 1 by a predetermined time. This leading edge delaying circuit can be omitted in the case of a common television receiver in which the horizontal deflection frequency is low. However, in a displaying apparatus in which the horizontal deflection frequency is high, the leading edge delaying circuit may be necessary for regulating the relation in relative phase between the pulse $V_{c1}$ outputted from the deflection portion and that $V_{c2}$ outputted from the high voltage generating portion.

Further, a part of the circuit of FIG. 5(B) is substantially the same as that shown in detail in FIG. 6. In this part of the circuit, a rectangular pulse $V_{osc}$, obtained by delaying the horizontal oscillating pulse $V_{osc}$ is applied to the horizontal excitation NPN transistor 9 and the base input resistance 10 thereof. The high voltage generating portion of the circuit of FIG. 5(B) is substantially the same as that shown in detail in FIG. 7. Thus, an operating principle of the high voltage generating portion is substantially the same with the operating principle of the corresponding portion of the first example of the conventional device above described.

In the second conventional horizontal deflection and high voltage generating circuit, in case where the pulse duration $t_{r2}$ of the high voltage pulse $V_{c2}$ is wide and the horizontal deflection frequency is high, the trailing edge of the horizontal deflection pulse (that is, the blanking pulse) $V_{c1}$ is made almost in agreement with that of the high voltage pulse $V_{c2}$ by the leading edge delaying circuit 8 so that the degree of freedom of conditions for the excitation of both of the output transistors 12 and 20 increases.

Thus, similarly as in case of FIG. 8(A), the waveform of each portion of the device is shown in FIG. 8(B) for a case where the pulse duration $V_{c2}$ of the pulse width $t_{r2}$ is made equal to 40% of the horizontal deflection period $t_h$.

First, the horizontal oscillating pulse $V_{osc}$ as shown in FIG. 8(B)(1), which is obtained by the horizontal oscillating circuit 1, becomes a rectangular pulse $V_{osc}$, of which the start is delayed by the leading edge delaying circuit 8 by a delay time $t_{dm}$ and which is applied to the horizontal excitation circuit 2. Then, the output of the horizontal excitation circuit 2 has the waveform bottomed by an interval which is longer than the pulse duration $t_{osc}$, by a storage time $t_{sd}$ due to storage time effects of the horizontal excitation transistor 9 and becomes the horizontal excitation pulse $V_{cd1}$ of FIG. 8(B)(3).

Next, the polarity of a primary winding 11a of the horizontal excitation transformer 11 and that of a second winding 11b thereof are determined such that the base current $I_{b1}$ of the horizontal output transistor 12 flows in the positive direction when the value of the horizontal excitation pulse $V_{cd1}$ is positive, as shown in FIG. 8(B)(4).

Then, after flowing in the positive direction as shown in FIG. 8(B)(4), the base current $I_{b1}$ of the horizontal output transistor 12 is immediately decreased to a negative value when the horizontal excitation pulse $V_{cd1}$ is bottomed, and further returns to the level of zero after the storage time $t_{s1}$ of the horizontal output transistor 12 passes.

When the storage time $t_{s1}$ elapses, the state of the horizontal output transistor 12 is changed from an on-state to an off-state. Simultaneously with this, the horizontal deflection pulse $V_{c1'}$ which is a sinusoidal half-wave as shown in FIG. 8(B)(5), is generated at the collector of the transistor 12. The oscillation period of this sinusoidal half-wave, that is, the horizontal deflection pulse $V_{c1'}$ is determined by the resonance of the blanking resonance capacitor 14 and the horizontal deflector coil 4. Further, when the blanking interval $t_{r1}$ passes, up to the time at which the current $I_{b1}$ reaches the level of zero again, a damper current $I_{d'}$ automatically flows out thereafter as shown by a dashed line of FIG. 8(B)(6) and increases nearly linearly towards the positive direction and is smoothly connected to the graph of a collector current $I_{c1}$ shown by a solid line of FIG. 8(B)(6).

On the other hand, by the similar process, the collector voltage (that is, the high voltage excitation pulse) $V_{cd2}$ of the high voltage transistor 17 of the high voltage generating portion becomes a rectangular wave bottomed by an interval which is longer than a period $t_{osc}$ of time of the horizontal oscillating pulse $V_{osc}$ (the pulse duration) by a storage time $t_{stg2}$ of the high voltage excitation transistor 17 due to storage time effects of the horizontal excitation transistor 9 as shown in FIG. 8(B)(7). Further, similarly as in case of the deflection portion, the base current $I_{b2}$ of the high voltage output transistor 20 flows during a period when the high voltage excitation pulse $V_{cd2}$ is positive. Further, the base current $I_{b2}$ flows towards the negative direction after the state of the high voltage excitation pulse $V_{cd2}$ is changed into a low level, and returns to the level of zero after a storage time $t_{s2}$ peculiar to the high voltage output transistor 20.

While the base current $I_{b2}$ of the high voltage output transistor 20 in the high voltage generating portion flows toward the positive direction, and after flowing in the negative direction and then returns to the level of zero, the collector current $I_{c2}$ continues flowing. Further, the current $I_{c2}$ becomes zero after the storage time $t_{s2}$ passes. At that time, the sinusoidal half-wave from the collector, that is, the high voltage pulses $V_{c2}$ shown in FIG. 8(B)(9), start occurring.

Further, when the pulse duration $t_{r2}$ of this high voltage pulse $V_{c2}$ expires, the damper current $I_{d2}$ automatically flows out, as represented by a dashed line shown in FIG. 8(B)(10) which is connected to the graph of the collector current $I_{c2}$ of the high voltage output transistor 20. Thus, as in case of the example of the current in a deflection portion of FIG. 8(B)(6), there is obtained a linearly increasing current waveform.

Here, there occurs a problem concerning the rise time of the horizontal excitation pulse $V_{cd1}$ shown in FIG. 8(B)(3), that is, the time T when the base current $I_{b1}$ of the horizontal output transistor 12 shown in FIG. 8(B)(4) commences flowing out.

As is understood from FIG. 8(B), the time T is considerably influenced by the pulse duration $t_{osc}$ of the horizontal excitation pulse $V_{osc}$ and the storage time $t_{stg1}$ of the horizontal excitation transistor 9. Further, the time T is, as can be understood from FIG. 8(B), substantially influenced by a delay time $t_{d1}$ and the pulse duration $t_{osc'}$. Specifically, the storage time $t_{stg1}$ varies widely between the excitation transistors 9 and is subjected to the influence of ambient temperature.

If the time T is changed by such influence and becomes subsequent to the time $T_o$ when the collector current $I_{c1}$ of FIG. 8(B)(6) crosses the zero level, the collector current $I_{c1}$ cannot flow out and the graphs of the currents cannot be smoothly connected to each other because the base current $I_{b1}$ of the horizontal output transistor 12 is zero even when the damper current $I_{d1}$ reaches the level of zero and thus cannot further flow. Further, it is well known that if the device enters such a state, a small pulse occurs in the neighborhood of the center of the horizontal deflection pulse (that is, a collector pulse) $V_{c1'}$ of FIG. 8(B)(5), and the collector loss of the horizontal output transistor 12 suddenly increases along with the danger of being destroyed.

In FIG. 8(B)(6), the maximum value $I_{d1p}$ of the damper current $I_{d1}$ is drawn to be a little less than the maximum value $I_{c1p}$ of the collector $I_{c1}$. This is because, in an ideal state of the device in which the circuit loss is zero, both of the maximum values $I_{d1p}$ and $I_{c1p}$ are equal to each other. However, practically the resistance component of the circuit influences the power which is derived from the horizontal output transformer 15. The maximum value $I_{d1p}$ of the damper current $I_{d1}$ becomes less than that $I_{c1p}$ of the collector current $I_{c1}$ and thus the time $T_o$ at which the collector current $I_{c1}$ crosses the zero level is changed to an earlier moment.

This means that the time T may be subsequent to the time $T_{ol}$. Thus, it is preferable that the time T is made still earlier. However, in contrast, if the time T is too early and is prior to the time $T_{11}$ at which the blanking interval $t_{r1}$ passes, the collector current $I_{c1}$ flows during the time that collector voltage $V_{c1}$ is present, thereby causing the sudden increase in collector loss. Thus, the occurrence of such a situation should be avoided. In a case where the horizontal deflection frequency is high, particular attention should be paid because the interval between the times $T_{11}$ and $T_{o1}$ is small.

Further, the delay time $t_{d1}$ and the pulse duration $t_{osc}$, can be accurately determined to some extent by adjusting circuit constants. In contrast, the storage time $t_{stg1}$ is changed due to the temperature characteristics peculiar to transistors and thus, in a case where the horizontal deflection frequency is high, some compensation is necessary.

However, on the other hand, it can be seen from FIG. 8(B)(8)–(10), the time T', at which the base current $I_{b2}$ of the high voltage output transistor 20 of the high voltage generating portion flows out, is unlike the time T and relates to the pulse duration $t_{osc}$ of the horizontal oscillating pulse $V_{osc}$. The time T' should be naturally positioned between moments $T_{12}$ and $T_{o2}$. However, it is inconvenient for the control of the circuit that elements required to determine the time T are different from elements required to determine the time T'. On the other hand, it becomes very convenient for the construction of the circuit if the times T and T' operate in a substantially similar manner by controlling only one element of the circuit.

Further, the high voltage generating portion is different from the deflection portion in that the pulse duration $t_{r2}$ of the high voltage pulse $V_{c2}$ is long and thus a bottoming interval (that is, a period of a base portion of the pulse) $t_{pb}$ is short and thus, the interval between the moments $T_{12}$ and $T_{o2'}$ which are within a permitted limit of the time T', becomes small. This is liable to cause difficulty in case of high resolution display of which the total horizontal deflection period $t_h$ is short.

In addition, when the luminosity of the screen of the picture tube is increased, the load current of the dc high voltage EHT increases and the pulse duration $t_{r2}$ tends to extend like the pulse duration $t_{r2'}$. Thus, the condition for the pulse duration $t_{r2}$ becomes still more severe.

However, in order to precisely regulate the time T', the pulse duration $t_{osc}$ of the horizontal oscillating pulse $V_{osc}$ outputted from the horizontal oscillating circuit 1 of the conventional circuit shown in FIG. 5(B) should be regulated, as can be seen from FIG. 8(B). However, it is usually difficult in the conventional horizontal oscillating circuit, especially in a manufactured IC circuit, to change only the pulse duration $t_{osc}$ of the horizontal voltage oscillating pulse $V_{osc}$ without changing the oscillating frequency thereof. This has been a bottleneck in design of the device.

Furthermore, even if the time T' can be ideally set by regulating the pulse duration $t_{osc}$ of the horizontal oscillating pulse $V_{osc'}$ the time T relating to the deflection portion is determined regardless of the pulse duration $t_{osc}$. Thus, there also occurs a problem that the time T' cannot be necessarily set to the ideal value.

Moreover, the time T' is unlike the time T and relates to the pulse duration $t_{osc}$ of the horizontal oscillating pulse $V_{osc}$ and to the storage time $t_{stg2}$ of the high voltage excitation transistor 17 of the high voltage generating portion. As above described, the time T' should be positioned between moments $T_{12}$ and $T_{o2}$. However, if the time T' is outside of this interval between the moments $T_{12}$ and $T_{o2'}$ the loss experienced in the high voltage output transistor 20 suddenly increases.

Further, the storage time $t_{stg2}$ may vary substantially with temperature. Additionally, the excitation transistors 9 and 20 are different from each other in their mounting positions and the generating heat. Therefore, the storage time $t_{stg2}$ cannot necessarily be made equal to that $t_{stg1}$ and change in agreement with that $t_{stg1}$.

Still further, as above stated, the deflection portion and the high voltage generating portion are different in the pulse durations $t_{r1}$ and $t_{r2}$ of the pulses $V_{c1}$ and $V_{c2}$ occurring at the collectors of the output transistors and in the energy derived from the circuit (the power loss) from each other. Therefore, the most appropriate value of the time T is different from that of the time T'. In addition, as above described, elements for determining the times T and T' change independently of each other. Thus, some countermeasures are needed to set the times T and T' to ideal values.

The present invention is provided to resolve the above described problems of the conventional device.

SUMMARY OF THE INVENTION

To achieve the foregoing object and in accordance with a first aspect of the present invention, there is provided a horizontal deflection and high voltage generating circuit having a horizontal oscillating circuit, a horizontal excitation circuit responsive to an oscillating pulse outputted from the horizontal oscillating circuit, a horizontal output circuit excited by an output of the horizontal output circuit to be excited by an output of the horizontal excitation circuit, a high voltage output circuit responsive to an oscillating pulse outputted from the horizontal oscillating circuit, which comprises a delay circuit for causing a lag in a leading edge of the oscillating pulse applied from the horizontal oscillating circuit to the horizontal excitation circuit with respect to a leading edge of the oscillating pulse applied from the horizontal oscillating pulse to the high voltage output circuit, the lag being a predetermined delay time, a value of which is set in such a manner that a trailing edge of a horizontal deflection pulse generated by the horizontal output circuit is substantially in agreement with a trailing edge of a high voltage pulse generated by the high voltage output circuit, and such that the high voltage pulse has a pulse duration larger than a pulse duration of the horizontal deflection pulse generated by the horizontal output circuit.

Thereby, operating conditions of output transistors of the horizontal deflection circuit and high voltage generating circuit can be facilitated. Further, the conditions for the excitation of the output transistors of the horizontal deflection and of the high voltage generating portion can be properly maintained. This can prevent the occurrence of a problem in the security of the transistors.

Further, the horizontal blanking interval can be shortened so that the range of the picture which can be effectively used can be enlarged in comparison with the conventional apparatus. Furthermore, the pulse duration of the high voltage pulse can be lengthened so that the regulation of the high voltage against the change in the luminosity of the screen can be improved. In addition, the loss in the high voltage output transistor can be reduced. Further, the high voltage output characteristics can be improved.

Moreover, in an embodiment of the inventive horizontal deflection and high voltage generating circuit, the delay circuit comprises a first monostable multivibrator triggered by a leading edge of the horizontal oscillating pulse for outputting a pulse having a pulse duration corresponding to the predetermined delay time and a second monostable multivibrator triggered by a trailing edge of a pulse outputted by the first monostable multivibrator, whereby the oscillating pulse outputted from the horizontal oscillating circuit is directly supplied to said high voltage output circuit without going through the delay circuit.

Further, in an embodiment of the horizontal deflection and high voltage generating circuit, the delay circuit comprises a rectifying integrator for integrating the oscillating pulse and a waveform shaping circuit for shaping an output waveform of the integrating circuit and outputting a rectangular pulse, whereby the oscillating pulse outputted from the horizontal oscillating circuit is directly supplied to the high voltage output circuit without going through the delay circuit.

Furthermore, in an embodiment of the horizontal deflection and high voltage generating circuit, a pulse duration of the oscillating pulse of the horizontal oscillating circuit is regulated by a manual or automatic means for regulating a waveform of the oscillating pulse of the horizontal oscillating circuit so as to initiate conduction of an output transistor of the high voltage output circuit after an end of the high voltage pulse by a time period approximately equal to $\frac{1}{4}$ of a down period of the high voltage pulse.

In accordance with a second aspect of the present invention, there is provided a horizontal deflection and high voltage generating circuit having a horizontal oscillating circuit, a horizontal excitation circuit responsive to an oscillating pulse outputted from the horizontal oscillating circuit, a horizontal output circuit excited by an output of the horizontal excitation circuit, a high voltage output circuit responsive to an oscillating pulse outputted from the horizontal oscillating circuit, which comprise a first monostable multivibrator triggered by a leading edge of the horizontal oscillating pulse for outputting a pulse having a pulse duration corresponding to a predetermined delay time, a second monostable multivibrator triggered by a trailing edge of a pulse outputted by the first monostable multivibrator, and an OR circuit for receiving the output pulse of the first monostable multivibrator and an output pulse of the second monostable multivibrator and performing an OR operation of the outputs of the first and second monostable multivibrators, wherein the output pulse of the second monostable multivibrator is applied to the horizontal excitation circuit, and an output of the OR circuit is applied to a high voltage excitation circuit of the high voltage output circuit, a duration of the output pulse of the first monostable multivibrator is set such that a trailing edge of horizontal deflection pulse generated by the horizontal output circuit is nearly in agreement with a trailing edge of the high voltage pulse produced by a high voltage output circuit, the high voltage pulse having a pulse duration larger than a pulse duration of the horizontal deflection pulse, and wherein a duration of the output pulse of the second monostable multivibrator is set such that conduction of an output transistor of the high voltage output circuit initiates after an end of the high voltage pulse by a time period approximately equal to $\frac{1}{4}$ of a down period of the high voltage pulse.

Thereby, the time of initiation of conducting the base current of the output transistors of the horizontal deflection and high voltage generating portions can be regulated by a simple method. The above described problem of the reliability of the conventional apparatus can be satisfactorily resolved. Furthermore, the conditions for the excitation of the output transistors of the horizontal deflection portion and the high voltage output portion can be properly maintained. The reliability of the transistors can be improved. Especially, the improved circuit may be included in a display for use in a computer wherein the horizontal deflection frequency is high and the frequency standard is not determined, and the operating condition is severe, in comparison with a common television receiver.

In accordance with a third aspect of the present invention, there is provided a horizontal deflection and high voltage generating circuit having a horizontal oscillating circuit, a horizontal excitation circuit responsive to an oscillating pulse outputted from the horizontal oscillating circuit, a horizontal output circuit excited by an output of the horizontal excitation circuit, a high voltage output circuit responsive to an oscillating pulse outputted from the horizontal oscillating circuit, which comprises a first monostable multivibrator triggered by a leading edge of the horizontal oscillating pulse for outputting a pulse having a pulse duration corresponding to a predetermined delay time and a second monostable multivibrator triggered by a trailing edge of a pulse outputted by the first monostable multivibrator, wherein the value of the pulse duration of the output pulse of the first monostable multivibrator is set to initiate conduction of a horizontal output transistor within the horizontal output circuit after an end of horizontal deflection pulse generated at the collector of the horizontal output circuit by a time period approximately equal to $\frac{1}{4}$ of a down period of the horizontal deflection pulse, and further the pulse duration of the oscillating pulse of the horizontal oscillating circuit is set to initiate conditions of an output transistor of the high voltage output circuit after an end of the high voltage pulse by a time period approximately equal to ¼ of a down period of the high voltage pulse.

Thereby, the conditions of the excitation of the output transistors of the horizontal deflection portion and the high voltage generating portion can be maintained in the state in which the reliability is highest. Especially, the circuit may be used to improve the performance of a high resolution display equipment wherein the horizontal deflection frequency is high.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 1(B) is a schematic block diagram showing the construction of a second embodiment of the present invention;

DETAILED DESCRIPTION OF PREFERRED EMBODIMENTS

Hereinafter, preferred embodiments of the present invention will be described in detail by referring to the accompanying drawings.

Figure 1A:
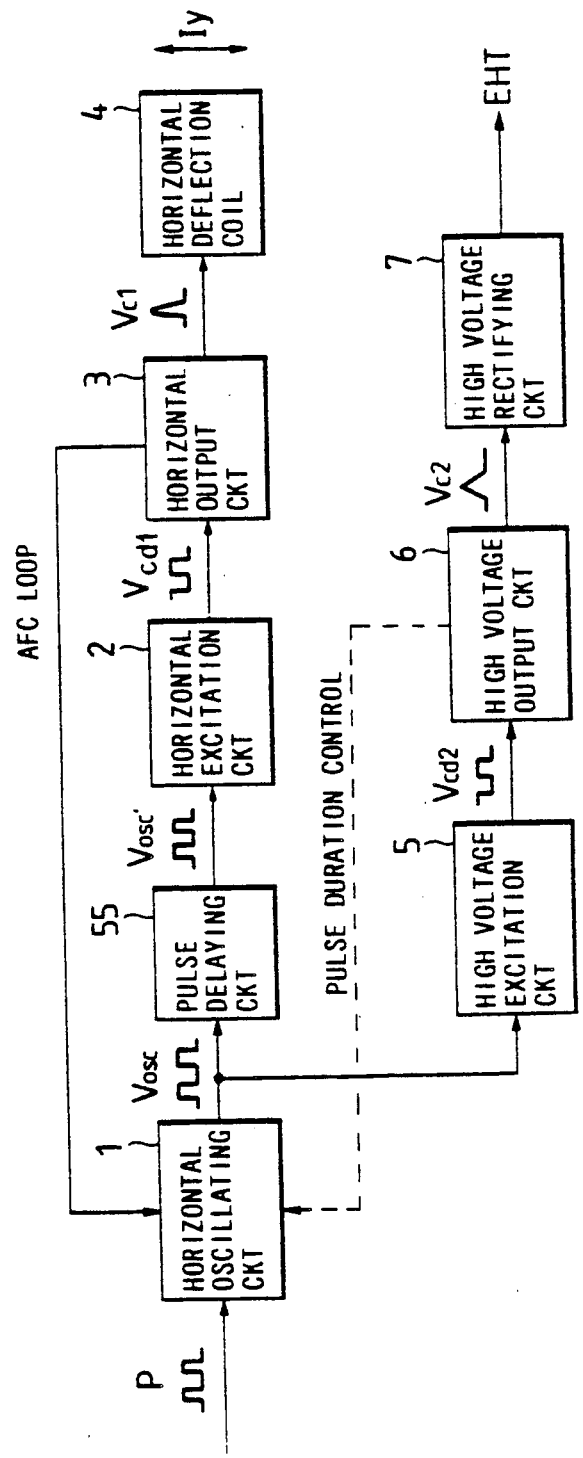
FIG. 1(A) is a schematic block diagram showing the construction of a first embodiment of the present invention.

Referring first to FIG. 1(A), there is shown a first preferred embodiment of the present invention. In this figure, reference numerals 1-7 indicate like portions of FIG. (A). Therefore, the detailed descriptions of such portions are omitted for simplicity of the description.

In the circuit of this figure, the characteristic feature is a pulse delaying circuit 55 which is inserted between the horizontal oscillating circuit 1 and the horizontal excitation circuit 2, and thereby a rectangular pulse $V_{osc'}$ is obtained and is further supplied to the horizontal excitation circuit 2.

Figure 2A:
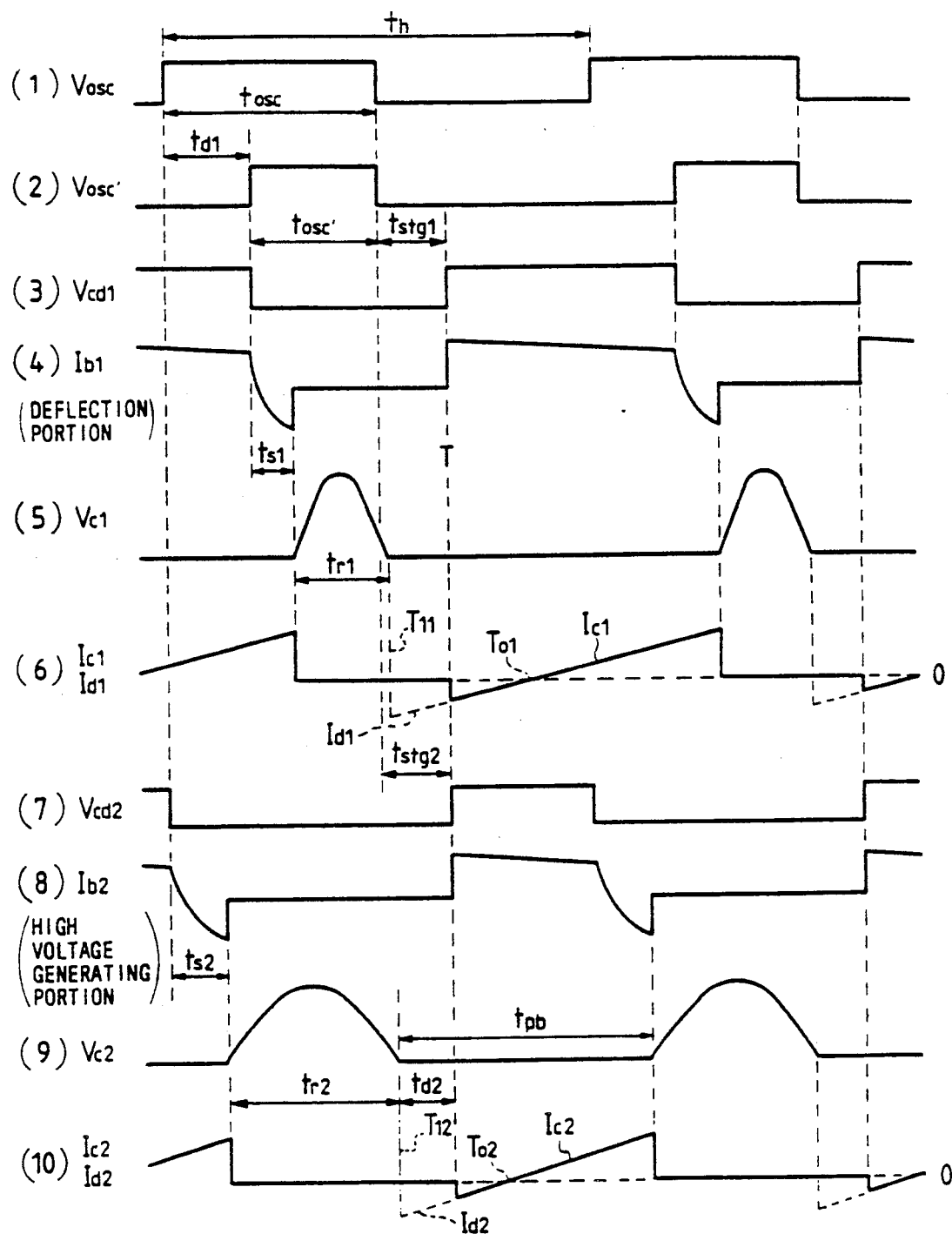
FIG. 2(A) is a waveform chart illustrating operations of portions of the circuit of FIG. 1(A)

FIG. 2(A) is a waveform chart for illustrating operation of the circuit of FIG. 1(A). First, the horizontal oscillating pulse $V_{osc}$ of FIG. 2(A)(1) is obtained in the horizontal oscillating circuit 1. Next, the pulse delaying circuit 55 provides a rectangular pulse $V_{osc'}$, of which the leading portion or edge (that is, the first transition) is delayed by a delay time $t_{d1}$ as shown in FIG. 2(A)(2) from the pulse of FIG. 2(A)(1). The pulse $V_{osc'}$ is fed to the horizontal oscillating circuit 2. Then, the horizontal excitation circuit 2 outputs the horizontal excitation pulse $V_{cd1}$ of FIG. 2(A)(3) which bottoms (remains at the low voltage level thereof) for a period longer than the pulse duration $t_{osc'}$ of the rectangular pulse $V_{osc'}$ by a storage time $t_{stg1}$ of the horizontal excitation transistor 9. This delay is due to the storage time effects of the internal horizontal excitation transistor 9.

A horizontal output transistor 12 conducts only when the horizontal excitation circuit $V_{cd1}$ is positive and during the storage time $t_{s1}$ of the horizontal output transistor 12. The collector pulse (the horizontal deflection pulse) $V_{c1'}$ which is a sinusoidal half-wave, shown in FIG. 2(A)(5) is generated when the transistor 12 is cut off. Further, after the time (that is, the blanking interval) $t_{r1}$ passes, as determined by the resonance period of the circuit, the damper current $I_{d1}$ flows out automatically from the time $T_{11}$, and is then connected to the collector current $I_{c1}$ which varies linearly. The time T, at which the damper current $1_{d1}$ is changed into the collector current $I_{c1'}$ is determined by the time at which the storage $t_{stg1}$ of the horizontal excitation transistor 8 passes. As above described by referring to FIG. 8(A), the time T is ideally placed nearly at the center of the interval between the time $T_{11}$ and the time $T_{o1}$ when the collector current $I_{c1}$ crosses the zero level.

On the other hand, in the high voltage portion, the horizontal oscillating pulse $V_{osc}$ is directly applied to the high voltage excitation circuit 5, and thus the high voltage excitation pulse, which bottoms during the pulse duration $t_{osc}$ thereof and also during the storage time $t_{stg2}$ of the high voltage excitation transistor 17, is obtained as an output of the high voltage excitation circuit 5. If the storage time $t_{stg1}$ of the high voltage excitation transistor 9 of the deflection portion is nearly equal to that $t_{stg2}$ of the excitation transistor 17 of the high voltage generating portion, the time at which the base current $I_{b2}$ of FIG. 2(A)(8) starts flowing is almost in agreement with the above described time T.

Therefore, as is seen from FIG. 2(A)(10), the time T, at which the damper current $I_{d2}$ of the damper diode 21 is changed with the collector current $I_{c2}$ of the high voltage output transistor 20, is centrally positioned between the time $T_{12}$, at which the pulse (the high voltage pulse of FIG. 2(A)(9)) ends with a duration $t_{r2}$ and $T_{o2}$, at which the collector current $I_{c2}$ crosses the zero level. Thus, as described above, the time at which the damper current $I_{d2}$ is changed with the collector current $I_{c2}$ is at the safest position on the time axis.

Figure 8A:
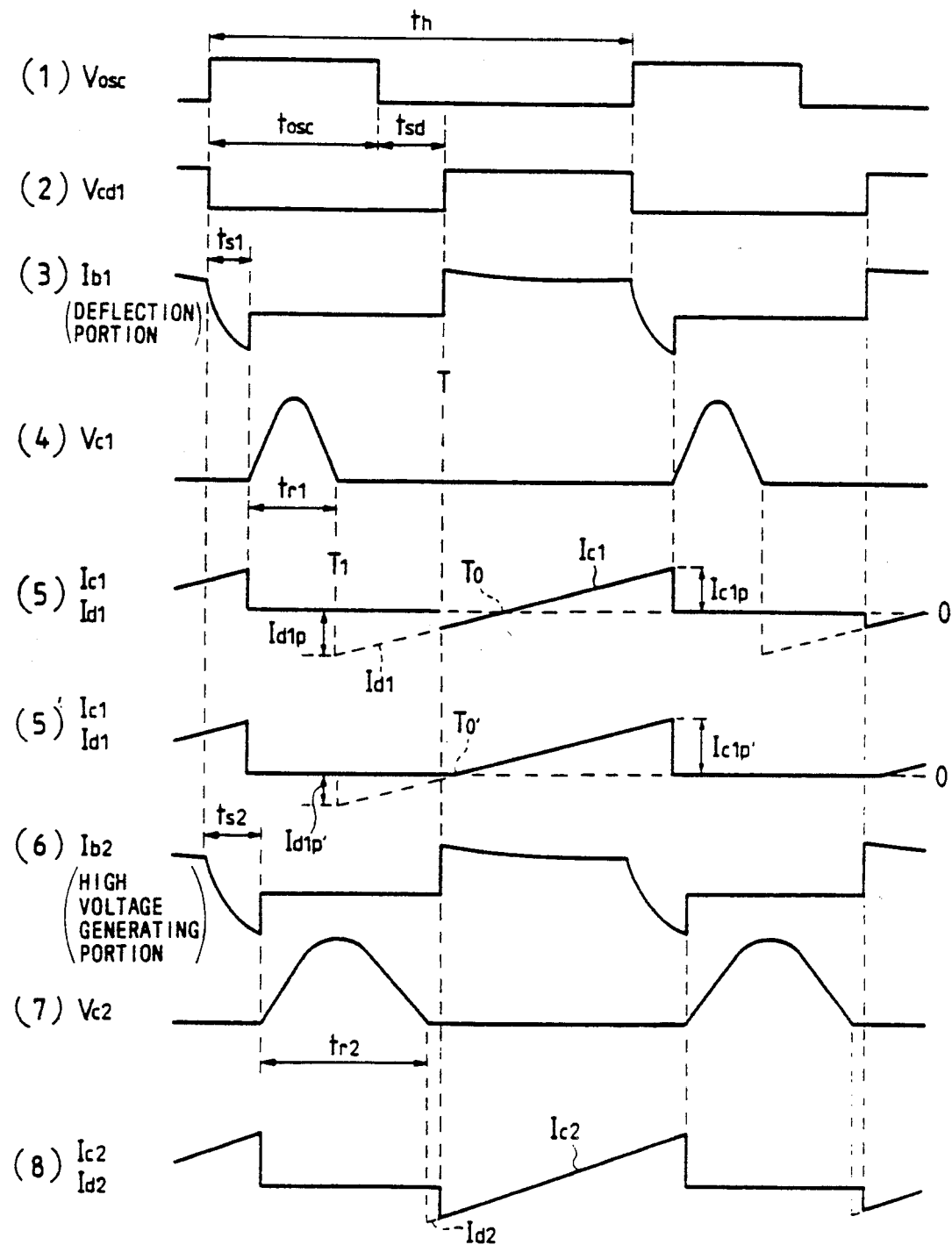
FIG. 8(A) is a waveform chart illustrating operations of portions of the circuit of FIG. 5(A)

In comparison with the conventional case of FIG. 8(A), it can be understood that although the blanking interval (the pulse duration) $t_{r1}$ in the deflection portion is taken as somewhat short and the pulse duration $t_{r2}$ in the high voltage generating portion is somewhat long, a time before and after the moment T in case of FIG. 2(A) is larger than a corresponding time in case of FIG. 8(A).

In such an ideal state, the value of the delay time $t_{d1}$ is determined according to each storage time and each pulse duration of the collector pulse such that the end of the collector pulse in the deflection portion (that is, the horizontal deflection pulse) $V_{c1}$ is almost in agreement with that of the collector pulse in the high voltage generating portion (that is, the high voltage pulse) $V_{c2}$. Then, the pulse duration $t_{osc}$ of the horizontal oscillating pulse $V_{osc}$ shown in FIG. 2(A)(1) is determined such that the time T is positioned almost at the center of the interval between the times $T_{12}$ and $T_{o2}$ in the collector pulse in the high voltage generating portion (the high voltage pulse) $V_{c2}$ of FIG. 2(A)(9) and in the collector current $I_{c2}$ shown in FIG. 2(A)(10).

If the time T is positioned almost at the center of the interval between the times $T_{12}$ and $T_{o2}$ in the high voltage generating portion, the pulse duration $t_{r1}$ of the horizontal deflection pulse is short in the deflection portion and thus the interval between the times $T_{11}$ and $T_{o1}$ is long and further the time T can be easily positioned in this interval.

The regulation of the pulse duration $t_{osc}$ of the horizontal oscillating pulse $V_{osc}$ may be achieved by manually regulating an internal constant of the horizontal oscillating circuit 1. Alternatively, it is possible that, at shown by a dashed line of FIG. 1(A), the interval between the time $T_{12}$ and the time T is detected from the high voltage output circuit 6 and the state of the horizontal oscillating circuit 1 is electrically controlled such that the detected value is equal to a preliminary and automatically set value. The practical method of the automatic control is described in detail in Japanese Utility Model Application No. 63-108443 entitled "A Horizontal Deflection Circuit" which has been proposed by the applicant of the instant application.

Further, as is understood from FIG. 2(A)(9) and (10), the preliminarily set value of the time $t_{d2}$ may be determined such that the time T (that is, the time at which the base currents $I_{b1}$ and $I_{b2}$ of the output transistors 12 and 20 start flowing) is positioned just at the center of the interval between the times $T_{12}$ and $T_{o2}$, that is, such that the time extends from the end of the high voltage pulse $V_{c2}$ for a time period approximately equal to ¼ of the bottoming period (the down period of the high voltage pulse $V_{c2}$) $t_{pb}$, neglecting the loss.

In case where the position of the time T is determined mainly on the basis of the high voltage generating portion in the above described manner, there is obtained a sufficient interval between the times $T_{11}$ and $T_{o1}$, and thus the time T is necessarily positioned therebetween in the deflection portion. Therefore, there is no danger for the high voltage output transistors 12 and 20.

Figure 3:
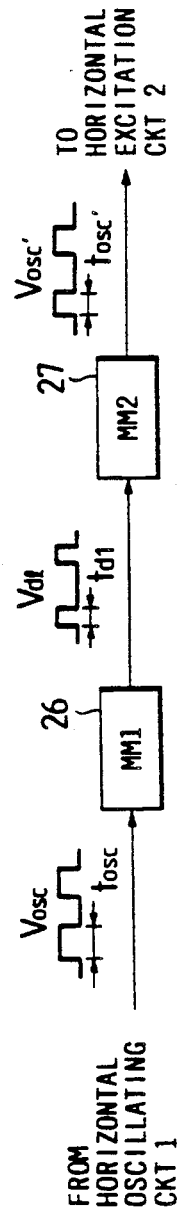
FIGS. 3 and 4 are circuit diagrams showing the detailed construction of portions of the circuit of FIG. 1(A)

Further, a circuit shown in FIG. 3 is devised as a pulse delaying means (that is, a pulse delaying circuit 55) for delaying the leading edge of the horizontal oscillating pulse $V_{osc}$ by the delay time $t_{d1}$. In this figure, reference characters 26 (MM1) and 27 (MM2) designate monostable multivibrators.

In the thus constructed means, first, the monostable multivibrator 26 (MM1) is triggered by the leading edge of the horizontal oscillating pulse $V_{osc}$ and then outputs the delay pulse $V_{dL}$ having a pulse duration which is equal to a predetermined delay time $t_{d1}$. Subsequently, the monostable multivibrator 27 (MM2) outputs the rectangular pulse $V_{osc'}$ which is triggered by the trailing edge (that is, the last transition) of the delaying pulse $V_{dL}$ and then rises. The pulse duration $t_{osc'}$ of the rectangular pulse $V_{osc'}$ is preferably determined by regulating a time constant of the monostable multivibrator 27 (MM2) such that the falling edge of the rectangular pulse $V_{osc'}$ is almost in agreement with that of the horizontal oscillating pulse $V_{osc}$.

Figure 4:
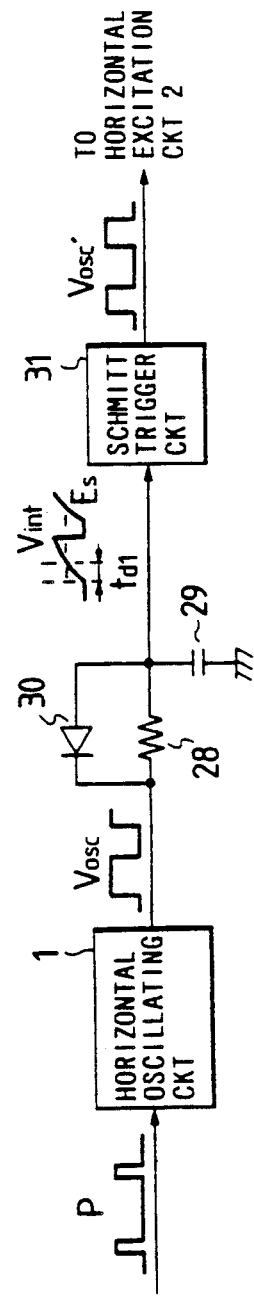

FIG. 4 shows a simpler example of the pulse delaying circuit 55. In this figure, reference numeral 28 denotes an integrating resistance; 29 an integrating capacitor; 30 a diode and 31 a Schmitt trigger circuit.

In this circuit, the horizontal oscillating pulse $V_{osc}$ of the horizontal oscillating 1 is integrated by the integrating circuit composed of the integrating resistance 28 with the diode 30 and the integrating capacitor 29.

Incidentally, an output impedance of the horizontal oscillating circuit 1 is assumed to be sufficiently low. Further, this integrating circuit is a rectifying integrator in which the diode 30 conducts when the horizontal oscillating pulse $V_{osc}$ falls, and the integrating action is not effected in the opposite direction. As a result, the waveform $V_{int}$ appears in the integrating capacitor 29 and is applied to the Schmitt trigger circuit 31 and rectified therein. Moreover, the rectangular pulse $V_{osc'}$ is obtained as an output thereof.

Thereby, since the horizontal oscillating pulse $V_{osc}$ rises, the magnitude of the signal $V_{int}$ gradually increases. When the magnitude of the signal $V_{int}$ exceeds a triggering threshold $E_s$ of the Schmitt trigger circuit 31, the position of the rise of the pulse $V_{osc'}$ is determined, and the position of the fall thereof is substantially the same with that of the horizontal oscillating pulse $V_{osc}$.

Therefore, a desired rectangular pulse $V_{osc'}$ is obtained by making the period from the rise of the signal $V_{int}$ to the time when the magnitude of the signal $V_{int}$ exceeds the threshold $E_s$ equal the delay time $t_{d1}$ which is described by referring to FIG. 2(A), by regulating a time constant by using the integrating resistance 28 and the integrating capacitor 29.

Next, a second preferred embodiment of the present invention will be described hereinbelow.

Referring now to FIG. 1(B), there is shown the second embodiment of the present invention. In this figure, reference numerals 1-8 indicate like portions of FIG. 5(B). Therefore, the detailed descriptions of such portions are omitted for simplicity of the description. Further, reference numeral 32 designates an OR circuit and 33 is a waveform shaping circuit.

Figure 2B:
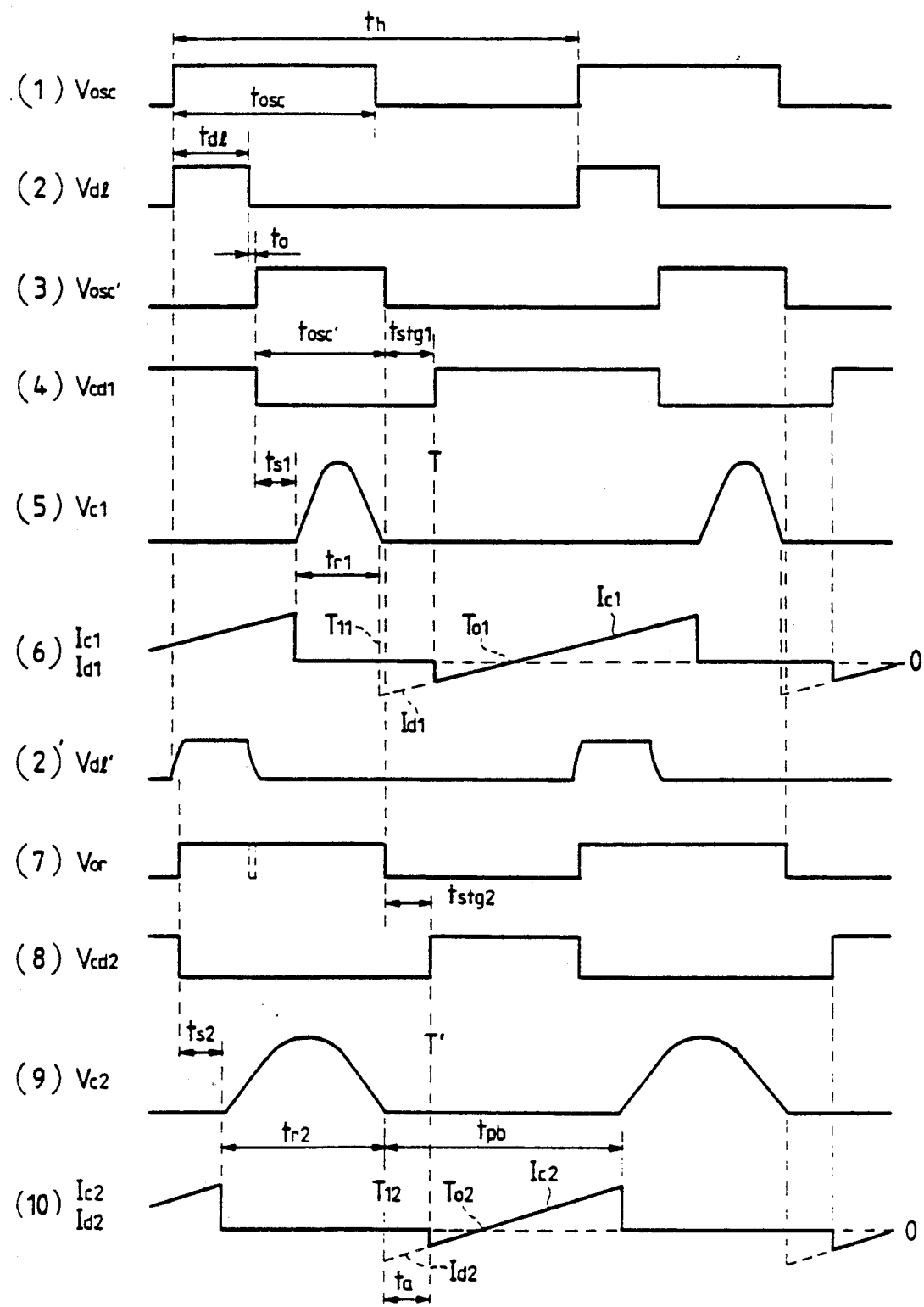
FIG. 2(B) is a waveform chart illustrating operations of portions of the circuit of FIG. 1(B)

FIG. 2(B) is a waveform chart for illustrating an operation of the circuit of FIG. 1(B).

First, FIG. 2(B)(1) shows the horizontal oscillating pulse $V_{osc}$ outputted from the horizontal oscillating circuit 1. The horizontal oscillating pulse $V_{osc}$ is applied to the first monostable multivibrator 26 (MM1) which is triggered at the rise of the horizontal oscillating pulse $V_{osc}$ and outputs a rectangular delay pulse $V_{dL}$ having a pulse duration $t_{dL}$ is supplied to the second monostable multivibrator 27 (MM2) which is triggered at the rise of the delay pulse $V_{dL}$ and outputs a rectangular pulse $V_{osc'}$ having a pulse duration $t_{osc'}$. Furthermore, similarly as in case of the conventional apparatus of FIG. 5(B), the pulse $V_{osc'}$ is supplied to the next horizontal excitation circuit 2.

Figure 5A:
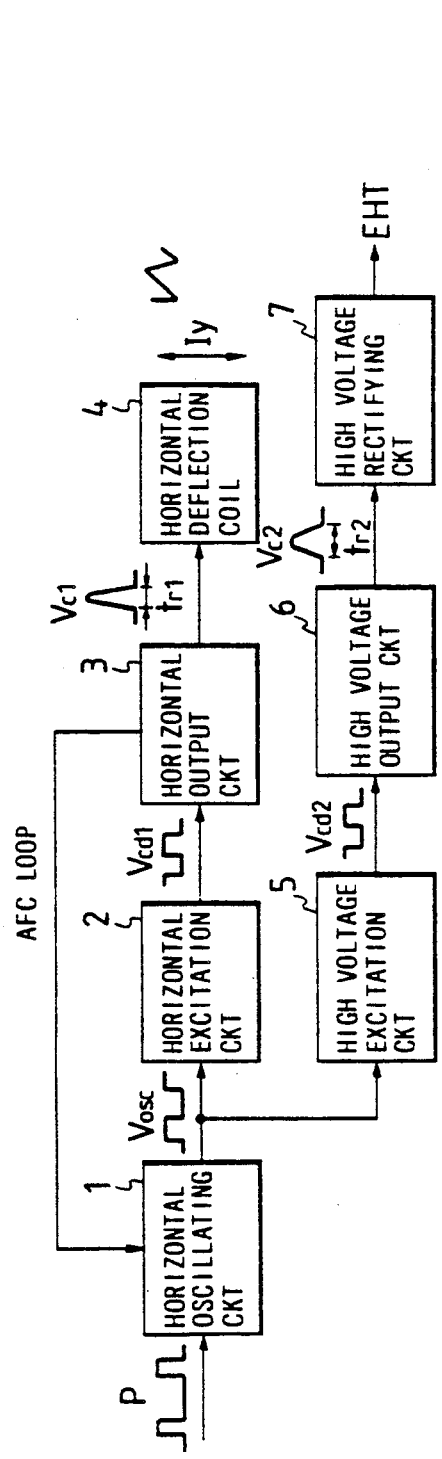
FIG. 5(A) is a schematic block diagram showing the construction of a first conventional circuit.
Figure 5B:
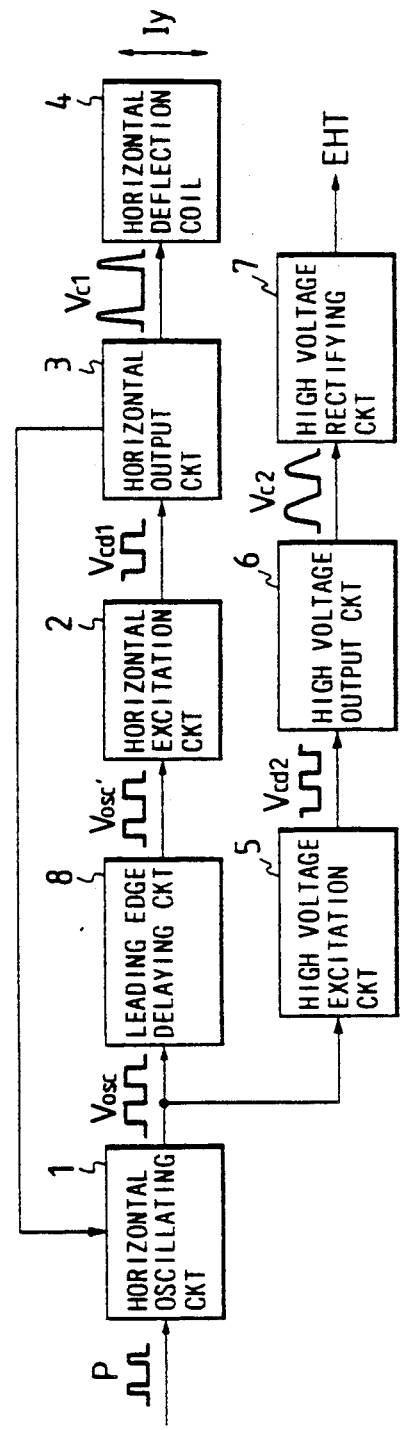
FIG. 5(B) is a schematic block diagram showing the construction of a second conventional circuit.
Figure 6:
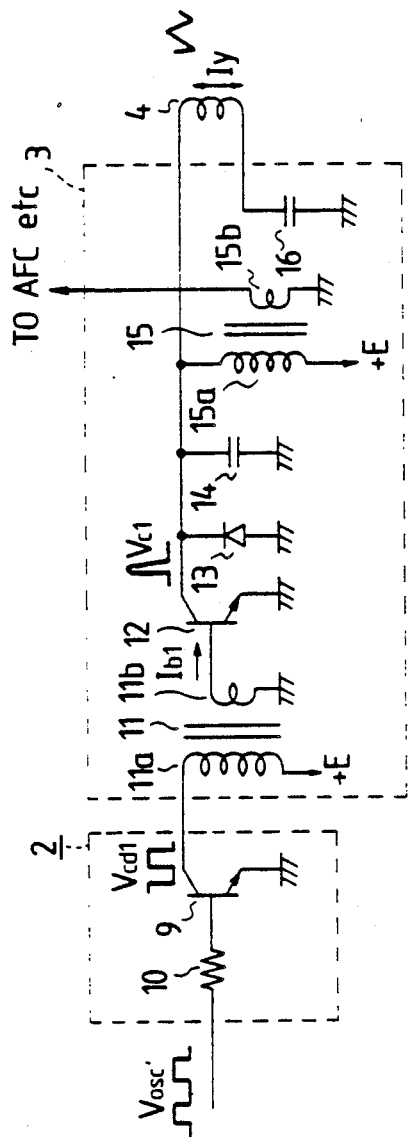
FIGS. 6 and 7 are circuit diagrams showing the detailed construction of the circuit of FIG. 5(A)
Figure 7:
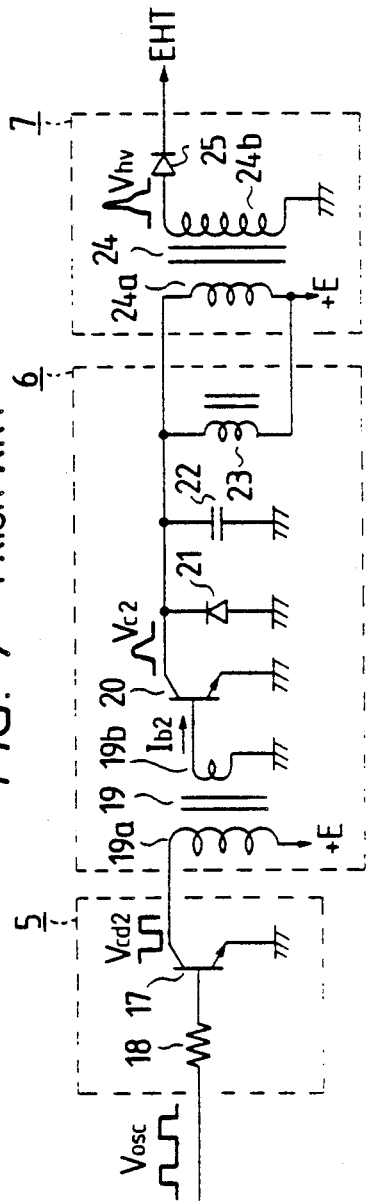
Figure 8B:
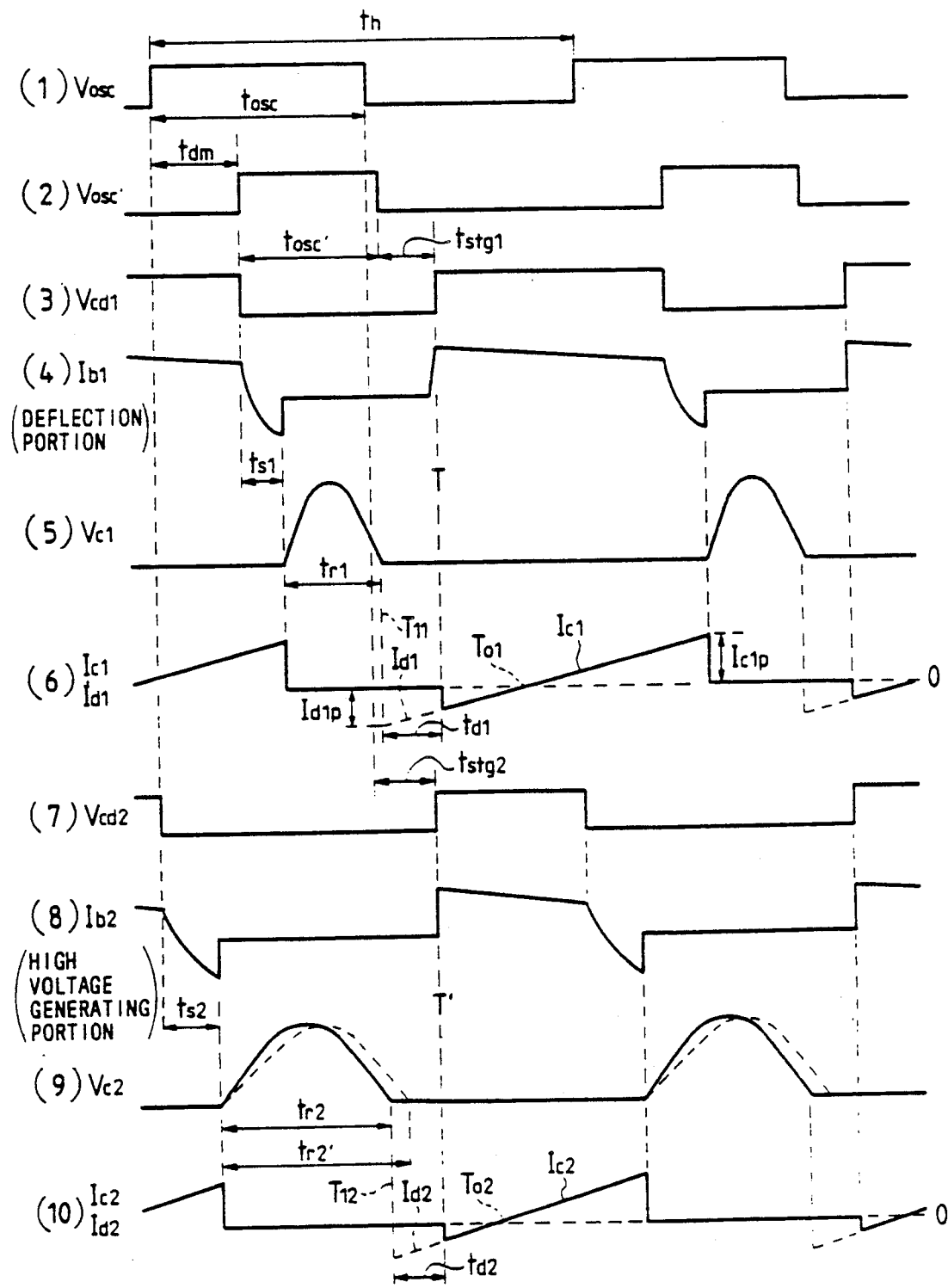
FIG. 8(B) is a waveform chart illustrating operations of portions of the circuits of FIG. 1(C) and FIG. 5(B)

Thus, as to the deflection portion, a rectangular horizontal oscillating pulse $V_{cd1'}$ which bottoms during only the pulse duration $t_{osc'}$ and the storage time $t_{stg1}$ of the horizontal exciting transistor 9, is obtained as an output of the horizontal oscillating circuit 2. When the pulse $V_{cd1}$ is supplied to the horizontal output circuit 3, the horizontal deflection pulse (the blanking pulse) $V_{c1'}$ as shown in FIG. 2(B)(5), is generated therein and the damper current $I_{d1}$ and the collector current $I_{c1}$ as shown in FIG. 2(B)(6) flow, similarly as in the conventional case as shown in FIGS. 5(B) and 8(B).

On the other hand, as to the high voltage generating portion, the delay pulse $V_{dL'}$ outputted by the monostable multivibrator 26 (MM1) shown in FIG. 2(B)(2) and the rectangular pulse $V_{osc'}$ outputted by the second monostable multivibrator 27 (MM2) shown in FIG. 2(B)(3) are supplied to OR circuit 32 which thus produces an output waveform (a rectangular pulse) $V_{or}$.

Incidentally, if the second monostable multivibrator 27 (MM2) is immediately triggered and the rectangular pulse $V_{osc'}$ rises just at the time of the fall of the delay pulse $V_{dL'}$ there arises no problem. Practically, the rise of the rectangular pulse $V_{osc'}$ is often delayed from that time by a short time $t_c$. Thus, there may occur a notch as indicated by a dashed line in FIG. 2(B)(7) in the waveform of the pulse $V_{or}$ which is outputted by the OR circuit 32 as the OR of the delay pulse $V_{dL}$ and the rectangular pulse $V_{osc'}$.

If this causes a problem, the delay pulse $V_{dL}$ should be applied to the OR circuit 32 after the trailing edge is delayed somewhat by letting the delay pulse $V_{dL}$ pass through the waveform shaping circuit 33.

This waveform shaping circuit 33 may be composed of a monostable multivibrator and so on. Alternatively, the waveform shaping circuit 33 may be adapted to first let the delay pulse $V_{dL}$ pass an integrating circuit, which has a simple structure having a resistor and a capacitor, to obtain the delay pulse $V_{dL'}$ having a modified waveform as shown in FIG. 2(B)(2)', circuit 33 then applying the delay pulse $V_{dL'}$ to the OR circuit 32.

Further, the pulse $V_{or}$ outputted from OR circuit 32 is fed to the high voltage excitation circuit 5 and then the high voltage excitation pulse $V_{cd2'}$ which bottoms during the time when the pulse $V_{or}$ is positive as well as during the storage time $t_{stg2}$ of the high voltage excitation transistor 17, is obtained at the collector terminal of the high voltage excitation transistor 17.

The rest of the operation of this embodiment is almost the same as that of the conventional apparatus of FIG. 8(B). When the high voltage excitation pulse $V_{cd2}$ is supplied to the high voltage output circuit 6, the generation of the high voltage pulse $V_{c2}$ of FIG. 2(B)(9) is delayed from the fall of the pulse $V_{cd2}$ by the storage time $t_{s2}$ and has a pulse duration $t_{r2}$ determined by the circuit constant. Further, similarly as in case of FIG. 8(B), as shown in FIG. 2(B)(10), the damper current $I_{d2}$ flows out after $T_{12'}$ the end of the pulse duration $t_{r2'}$ and the collector current of the high voltage output transistor 20 flows out after the time T' of the rise of the high voltage pulse $V_{cd2'}$ thereby forming a current waveform which increases linearly.

As is thus understood from FIG. 2(B), if the storage time $t_{stg1}$ of the excitation transistor 9 is nearly equal to that $t_{stg2}$ of the excitation transistor 17, the time T at which the output transistor 12 starts conducting is almost in agreement with that T' at which the output transistor 20 starts conducting. Moreover, the times T and T' can be simultaneously changed by regulating the pulse duration $t_{osc'}$ of the rectangular pulse $V_{osc'}$.

Thus, it is most secure that the times T and T' are positioned in the vicinity of the center of the interval between the times $T_{12}$ and $T_{o2'}$ that is, at a position corresponding to a first ¼ of the bottoming period $t_{pb}$ of the high voltage pulse $V_{c2}$ as described above by regulating the pulse duration $t_{osc'}$. If the time T' is positioned between the times $T_{12}$ and $T_{o2}$ in operation of the high voltage portion of the circuit, the time T is almost in agreement with the time T' as to operation of the deflection portion of the circuit. Furthermore, as to the deflection portion, the pulse duration $t_{r1}$ of the horizontal deflection pulse $V_{c1}$ is shorter than the pulse duration $t_{r2}$ of the high voltage pulse $V_{c2'}$ and the period between the moments $T_{11}$ and $T_{o1}$ is longer by the difference between the pulse duration $t_{r2}$ of the high voltage pulse $V_{c2}$ and the pulse duration $t_{r1}$ of the horizontal deflection pulse $V_{c1}$. Thus, the time T is surely positioned in this period of time, and there never occur reliability problems in the output transistors 12 and 20.

Further, the foregoing is realized on condition that the ends of the output pulses (that is, the horizontal deflection pulse $V_{c1}$ and the high voltage pulse $V_{c2}$) of both of the deflection and high voltage generating portions, namely, the times $T_{11}$ and $T_{12'}$ are almost in agreement with each other. Therefore, the pulse duration $t_{dL}$ of the delay pulse $V_{dL}$ outputted by the first monostable multivibrator 26 (MM1) should be regulated such that the above noted condition is satisfied.

Furthermore, as is understood from the description of FIG. 2, the minute regulation of the moments T and T' can be performed by regulating the pulse duration $t_{osc'}$ of the rectangular pulse $V_{osc'}$. Moreover, this can be easily achieved by changing the time constant of the second monostable multivibrator 27 (MM2). Further, the regulation of the time constant may be performed either by a manual method, using a variable resistance, or by an automatic method of controlling the second monostable multivibrator 27 (MM2) such that the moment T' is positioned between the moments $T_{12}$ and $T_{o2}$.

Figure 9:
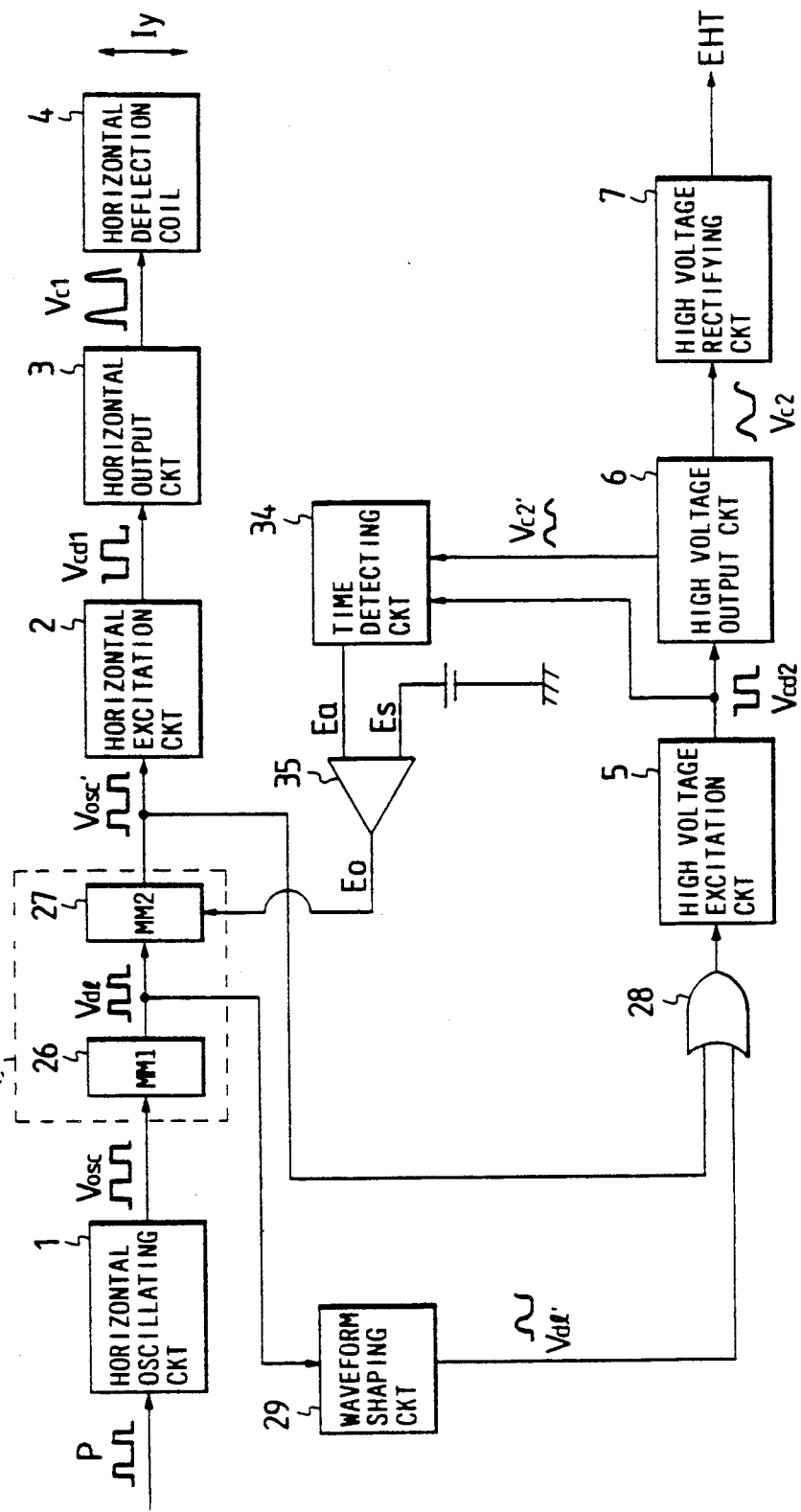
FIG. 9 is a schematic block diagram showing the construction of a circuit for regulating the rise time of the high voltage excitation pulse of the circuit of FIG. 1(B)

FIG. 9 is a schematic block diagram showing an example of a circuit for automatically regulating the time T'.

In this figure, reference characters 34, 35 and $E_{s'}$ which are not used in FIG. 1(B), are used as follows. That is, reference character 34 designates a time detecting circuit for detecting the time $t_a$ between the moments $T_{12}$ of FIG. 2(B)(10) and T'; 35 is an operational amplifier and $E_s$ is a reference voltage.

When the high voltage excitation pulse $V_{cd2}$ and the high voltage $V_{c2}$ (for convenience, the high voltage pulse $V_{c2'}$ transformed from the voltage $V_{c2}$ is actually used) are applied to the time detecting circuit 34 as shown in FIG. 9, the circuit 34 outputs the dc voltage $E_a$ proportional to the time ta.

This dc voltage $E_a$ is fed to the operational amplifier 35 and is then compared with the reference voltage $E_s$. Further, the second monostable multivibrator 27 (MM2) is controlled by an output voltage $E_a$ of the amplifier 35.

If the time T' is shifted from the ideal position thereof to an earlier position thereof, that is, the period ta is shortened due to factors such as production inaccuracies of the components or drift in the circuit operation and so on, the output voltage $E_a$ may be changed in response to this time shift and influences the second monostable multivibrator 27 (MM2) so as to lengthen the pulse duration $t_{osc'}$ of the rectangular pulse $V_{osc'}$. This is equivalent to shifting the position of the time T' to the right as viewed in FIG. 2(B), that is, to delaying the time T'. Consequently, the position of the time T', that is, the period ta, is never changed. In this case, the dc voltage Ea agrees with the reference voltage $E_s$. Thus, the period ta can be determined with the accuracy of the reference voltage $E_s$.

Incidentally, examples of the time detecting circuit 34 and of a monostable multivibrator 27 wherein the output-pulse duration is controlled by an external control voltage (output voltage) $E_s$ are described in detail in the Japanese Utility Model Application No. 63-108443.

Further, the predetermined value of the period ta is set to be nearly equal to ¼ of the bottoming period (down period of the pulse) of the high voltage pulse $V_{c2}$ (when ohmic loss in the circuit is disregarded) such that the time T' is positioned just at the center of the interval between the moments $T_{12}$ and $T_{o2}$. Further, the reference voltage $E_s$ is determined such that the length of the period ta is equal to the above value.

As is apparent from the foregoing description, in case of this embodiment, there is no necessity of modifying the horizontal oscillating circuit 1 in order to regulate the positions of the times T and T'.

Therefore, it is possible to design the horizontal oscillating circuit 1 mainly for stabilization of the horizontal oscillating frequency, and to improve the reliability of both the output transistor for the horizontal deflection and the output transistor for the high voltage generation.

Furthermore, in this embodiment, the times or moments T and T' are quite independent of the pulse duration $t_{osc}$ of the horizontal oscillating pulse $V_{osc}$. Thus, there occurs no problem in the reliability of the output transistors even in case the modification of the horizontal oscillating frequency of the horizontal oscillating circuit 1 is needed causing a change in the pulse duration $t_{osc}$ of the horizontal oscillating pulse $V_{osc}$. This is very advantageous in display devices for computer systems, in which a display device is required to have a changable horizontal deflection frequency to make the display device compatible with different computers connected thereto.

Next, a third embodiment of the present invention will be described in detail hereinafter.

Figure 1C:
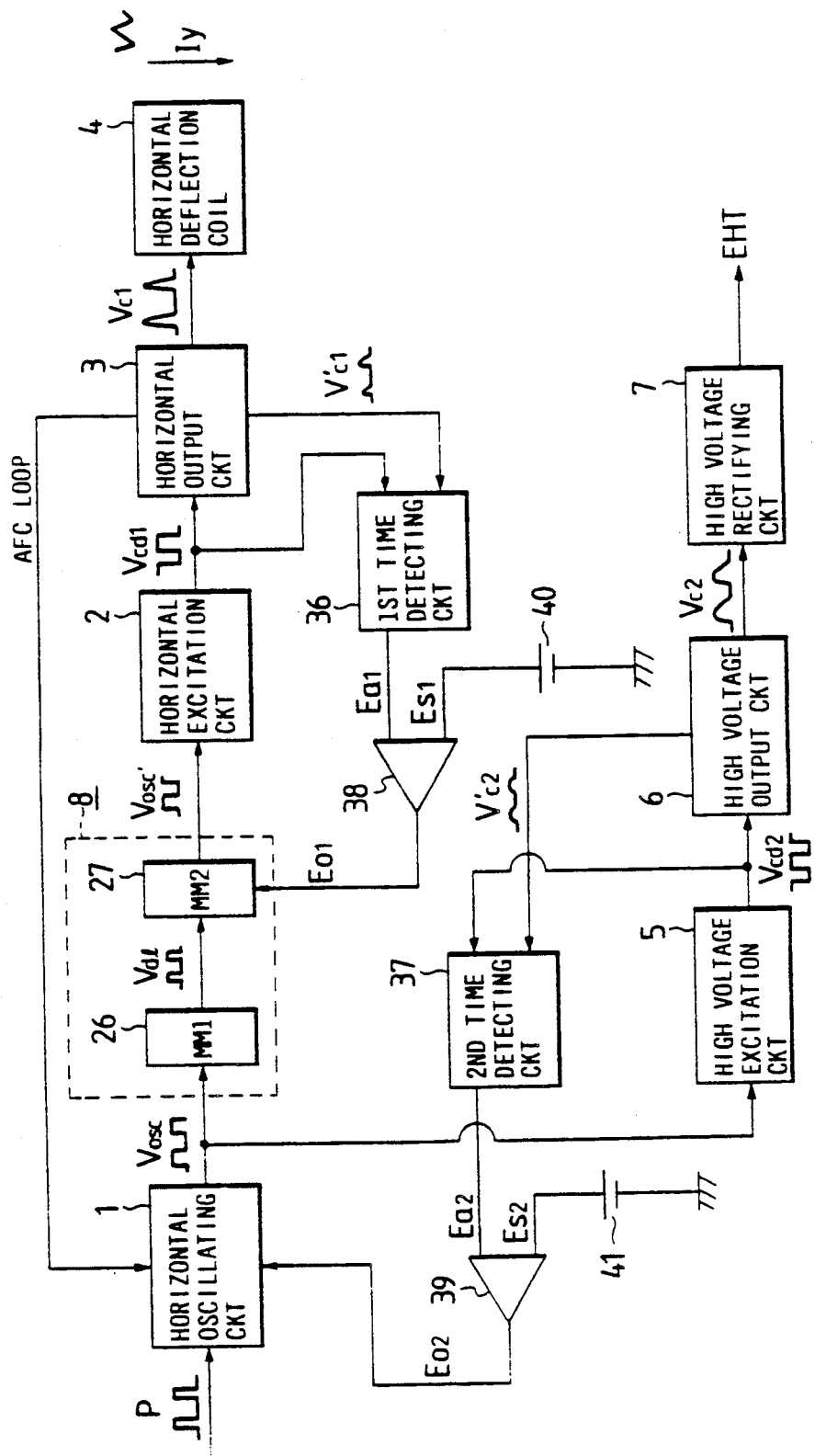
FIG. 1(C) is a schematic block diagram showing the construction of a third embodiment of the present invention.

Referring now to FIG. 1(C), there is shown the third embodiment of the present invention. In this figure, reference numerals 1-8 indicate like portions of FIG. 5(B). Therefore, the detailed descriptions of such portions are omitted for simplicity of the description. Further, the primary part of characteristic portions of this embodiment is indicated by reference numerals 36-39. That is, reference numeral 36 designates a first time detecting circuit; 37 is a second time detecting circuit; 38 and 39 are operational amplifiers; 40 is a reference voltage having a magnitude $E_{s1}$ and 41 is a reference voltage having a magnitude $E_{s2}$.

Further, an operation of this embodiment will be described by referring to FIG. 8(B) again. First, the horizontal excitation pulse $V_{cd1}$ and the horizontal deflection pulse $V_{cl}$ (in reality, an appropriately modified pulse $V_{cl'}$) are supplied to the first time detecting circuit 36 which outputs a dc voltage $E_{a1}$. This voltage is proportional to the interval $t_{d1}$ from the time $T_{11}$ corresponding to the trailing edge of the horizontal deflection pulse $V_{cl}$, which is a start of the down period thereof (practically, the pulse $V_{cl'}$), to the time T corresponding to the rise of the horizontal excitation pulse $V_{cd1}$. This dc voltage $E_{a1}$ is applied to the following operational amplifier 38 and is compared with the reference voltage 40 having the magnitude $E_{s1}$. Further, the output voltage representing the result of the comparison is applied to the second monostable multivibrator 27 (MM2) and controls the pulse duration $t_{osc'}$ of the output pulse (the rectangular pulse) $V_{osc'}$ thereof.

In this configuration, if the time $t_{d1}$ is longer than a standard value, that is, the position of the time T is shifted to the right as viewed in FIG. 8(B), or to the trailing edge of the pulse, the dc voltage $E_{a1}$ in response exceeds the reference voltage 40 (having the magnitude $E_{s1}$). As a result, by the action of the output voltage $E_{a1'}$ the duration $t_{osc'}$ of the rectangular pulse $V_{osc'}$ outputted by the second monostable multivibrator 27 (MM2), that is, the interval $t_{d1}$ is shortened. Consequently, this can make the position of the time T unchanged. The value of the interval $t_{d1}$ is determined such that the dc voltage $E_{a1}$ is always equal to the reference voltage 40 having the magnitude $E_{s1}$. Thus, the time T is determined with the accuracy of the reference voltage $E_{s1}$ and is not influenced by the drift or dispersion of the storage time $t_{stg1}$ and so on, so that the ideal value of the time T can be maintained. Referring to FIG. 8(B)(5) and (6), the time $t_{d1}$ is selected to cause the time T to be positioned at substantially the center of the interval between the moments $T_{11}$ and $T_{o1}$. When the ohmic loss in the circuit is disregarded, the magnitude $E_{s1}$ is determined to cause the time $t_{d1}$ to extend from the trailing edge of the horizontal deflection pulse $V_{c1'}$ for a period approximately equal to ¼ of the down period of the horizontal deflection pulse.

On the other hand, as can be seen from FIG. 8(B), as to the high voltage generating portion, the time T' is not influenced by the pulse duration $t_{osc'}$ and the storage time $t_{stg1}$. However, the time T' is influenced by the drift or dispersion of the storage time $t_{stg2}$ of the high voltage excitation transistor 17. Thus, it is necessary for compensation to directly change the pulse duration $t_{osc}$ of the horizontal oscillating pulse $V_{osc}$ outputted from the horizontal oscillating circuit 1.

Then, similarly as in the deflection portion, the second time detecting circuit 37 receives a pulse $V_{c2'}$. The pulse $V_{c2'}$ is obtained by reducing the magnitude of the high voltage pulse $V_{c2}$ and the high voltage excitation pulse $V_{cd2}$ in the high voltage generating portion. Then, as can be understood from FIG. 8(B)(9), the time $T_{12}$ can be detected from the trailing end of the high voltage pulse $V_{c2}$ which is a start of the down period thereof (practically, the pulse $V_{c2'}$). On the other hand, the time T' can be detected from the leading edge of the high voltage excitation pulse $V_{cd2}$ shown in FIG. 8(B)(7). Finally, the dc voltage $E_{a2}$ proportional to the interval $t_{d2}$ between the moments $T_{12}$ and T' is obtained as an output of the second voltage detecting circuit 37.

This dc voltage $E_{a2}$ is applied to the following operational amplifier 39 and is compared with the reference voltage 41 having the magnitude $E_{s2}$. Further, an output voltage $E_{02}$ of this operational amplifier 39 is applied to the horizontal oscillating circuit 1 and controls the pulse duration $t_{osc}$ of the horizontal oscillating pulse $V_{osc}$ outputted from the circuit 1.

Further, if, similarly as in the deflection portion, the interval $t_{d2}$ exceeds the preliminarily set standard value and as a result the dc voltage $E_{a2}$ exceeds the reference voltage 41 having the magnitude $E_{s2'}$ the pulse duration $t_{osc}$ of the horizontal oscillating pulse $V_{osc}$ outputted by the horizontal oscillating circuit 1 is shortened by the action of the output $E_{02}$ of the operational amplifier 39. This results in shifting the position of the time T' to the left as viewed in this figure, that is, to an earlier moment. Consequently, the position of the time T', that is, the interval $t_{d2'}$ does not change.

Further, similarly as in the deflection portion, the time T' is not influenced by the dispersion or drift of the storage time $t_{stg2}$ of the high voltage excitation transistor 17 and is determined with the accuracy of the reference voltage 41 having the magnitude $E_{s2}$. Thus, this reduces the possibility of damaging the high voltage output transistor 20. Referring to FIG. 8(B)(9) and (10), the time $t_{d2}$ is selected to cause the time T' to be positioned at substantially the center of the interval between the moments $T_{12}$ and $T_{o2}$. When the ohmic loss in the circuit is disregarded, the magnitude $E_{s2}$ is determined to cause the time $t_{d2}$ to extend from the trailing edge of the high voltage pulse $V_{c2}$ for a period approximately equal to ¼ of the down period of the high voltage pulse.

Furthermore, in this circuit, if the pulse duration $t_{osc}$ of the horizontal oscillating pulse $V_{osc}$ is changed, the position of the time T is not influenced, that is, T is entirely independent of the pulse duration $t_{osc}$. Thus, the position of the time T can be set or established independent of that of the time T' and both of the thus established ideal positions of the times T and T' can be maintained.

Figure 10:
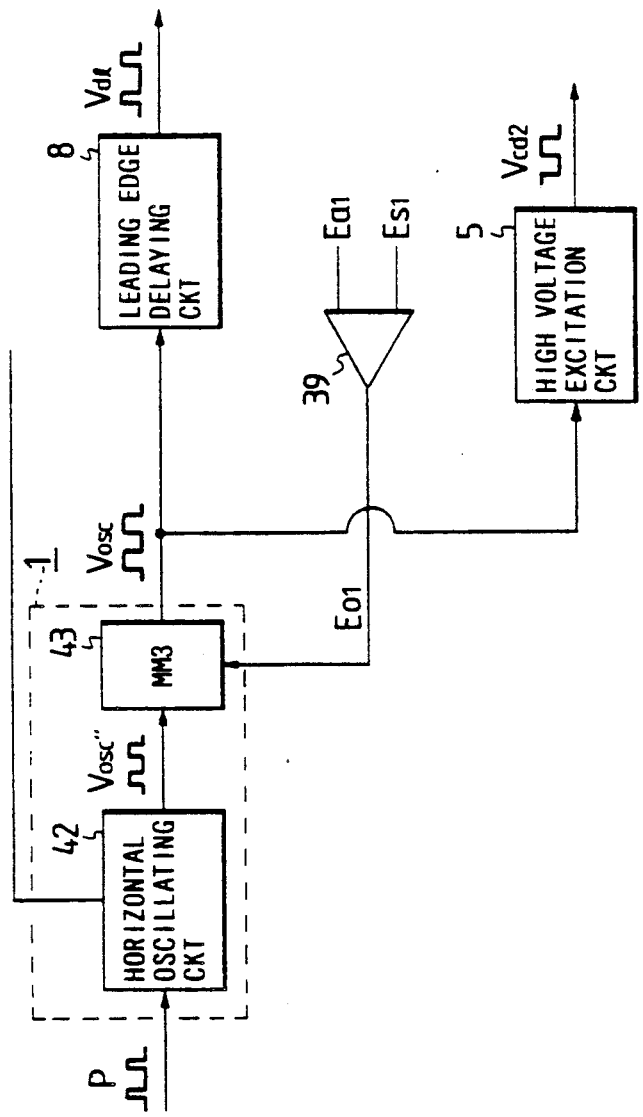
FIG. 10 is a schematic block diagram showing the detailed construction of the horizontal oscillating circuit of the circuit of FIG. 1(C).

In addition, in a case where the horizontal oscillating circuit 1 is composed of ordinary manufactured or ready-made integrating circuits (IC), it is usually difficult to change only the pulse duration $t_{osc}$ of the horizontal oscillating pulse $V_{osc}$ without changing the horizontal oscillating frequency. In such a case, it is preferable that, as shown in FIG. 10, the horizontal oscillating circuit 1 comprises the horizontal oscillating circuit 42 and a third monostable multivibrator 43 (MM3).

In case of the circuit of FIG. 10, if the third monostable multivibrator 43 (MM3) in the following stage is triggered at the time of the rise of the rectangular pulse $V_{osc'}$ outputted from the horizontal oscillating circuit 42 and further the pulse duration $t_{osc}$ of the horizontal oscillating pulse $V_{osc}$ outputted from the third monostable multivibrator 43 (MM3) is controlled by the operational amplifier 39, the pulse duration $t_{osc}$ of the horizontal oscillating pulse $V_{osc}$ can be controlled irrespective of the pulse duration of the rectangular pulse $V_{osc'}$ outputted from the horizontal oscillating circuit 42.

As above stated, in this embodiment, the time T relating to the deflection portion can be positioned at substantially the center of the interval between the moments $T_{11}$ and $T_{o1'}$ on the other hand the time T' relating to the high voltage generating portion can be positioned at substantially the center of the interval between the moments $T_{12}$ and $T_{o2}$. Namely, the times T and T' can be stably positioned ideally independent of each other. Thus, the horizontal deflection and high voltage generating circuit of the present invention suits, for example, a high resolution display device in which the horizontal deflection frequency is high.

Incidentally, examples of the first and second time detecting circuits 36 and 37, as well as the practical monostable multivibrators 27 and 43 of which the output-pulse duration can be controlled by respectively external control voltages (output voltage) $E_{o1}$ and $E_{o2}$ and so forth, are described in detail in the Japanese Utility Model Application No. 63-108443.

While preferred embodiments of the present invention have been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A horizontal deflection and high voltage generating circuit having a horizontal oscillating circuit, for generating an oscillating pulse, a horizontal excitation circuit responsive to an oscillating pulse outputted thereto from said horizontal oscillating circuit, a horizontal output circuit excited by an output of said horizontal excitation circuit, a high voltage generating circuit responsive to an oscillating pulse outputted from said horizontal oscillating circuit, said horizontal deflection and high voltage generating circuit including:

a delay circuit for delaying by a predetermined delay time a leading edge of the oscillating pulse applied from said horizontal oscillating circuit to said horizontal excitation circuit with respect to a leading edge of the oscillating pulse applied directly from the horizontal oscillating circuit to the high voltage generating circuit without going through said delay circuit, the predetermined delay time having a value which is set in such a manner that:

(a) a trailing edge of a horizontal deflection pulse occurring in said horizontal output circuit is substantially in agreement with a trailing edge of a high voltage pulse which is generated by said high voltage generating circuit and (b) that said high voltage pulse has a pulse duration larger than a pulse duration of the horizontal deflection pulse generated by said horizontal output circuit; and pulse duration regulating means for regulating the pulse duration of the oscillating pulse of said horizontal oscillating circuit manually or automatically so as to initiate conduction of an output transistor of said high voltage output circuit after an end of the high voltage pulse and before a collector current of said output transistor of said high voltage output circuit meets the level of zero.

2. A horizontal deflection and high voltage generating circuit having a horizontal oscillating circuit, a horizontal excitation circuit responsive to an oscillating pulse outputted from the horizontal oscillating circuit to operate, a horizontal output circuit to be excited by an output of the horizontal excitation circuit, a high voltage output circuit responsive to an oscillating pulse outputted from the horizontal oscillating circuit to operate, said horizontal deflection and high voltage generating circuit including:

a delay circuit for causing a lag to a leading edge of the oscillating pulse applied from said horizontal oscillating circuit to said horizontal excitation circuit with respect to a leading edge of the oscillating pulse applied from the horizontal oscillating circuit to the high voltage output circuit, the lag being a predetermined delay time, a value of which is set in such a manner that a trailing edge of a horizontal deflection pulse generated by said horizontal output circuit is substantially in agreement with a trailing edge of a high voltage pulse generated by said high voltage output circuit, and that said high voltage pulse has a pulse duration larger than a pulse duration of the horizontal deflection pulse generated by said horizontal output circuit, wherein said delay circuit comprises a first monostable multivibrator triggered by a leading edge of the oscillating pulse from said horizontal oscillating circuit for outputting a pulse having a pulse duration corresponding to the predetermined delay time and a second monostable multivibrator triggered by a trailing edge of the pulse outputted by said first monostable multivibrator, whereby the oscillating pulse outputted from the horizontal oscillating circuit is directly supplied to said high voltage output circuit without going through said delay.

3. A horizontal deflection and high voltage generating circuit having a horizontal oscillating circuit, a horizontal excitation circuit responsive to an oscillating pulse outputted from the horizontal oscillating circuit to operate, a horizontal output circuit to be excited by an output of the horizontal excitation circuit, a high voltage output circuit responsive to an oscillating pulse outputted from the horizontal oscillating circuit to operate, said horizontal deflection and high voltage generating circuit including:
- a delay circuit for causing a lag to a leading edge of the oscillating pulse applied from said horizontal oscillating circuit to said horizontal excitation circuit with respect to a leading edge of the oscillating pulse applied from the horizontal oscillating circuit to the high voltage output circuit, the lag being a predetermined delay time, a value of which is set in such a manner that a trailing edge of a horizontal deflection pulse generated by said horizontal output circuit is substantially in agreement with a trailing edge of a high voltage pulse generated by said high voltage output circuit, and that said high voltage pulse has a pulse duration larger than a pulse duration of the horizontal deflection pulse generated by said horizontal output circuit,
wherein said delay circuit comprises a rectifying integrator for integrating the oscillating pulse from said horizontal oscillating circuit and a waveform shaping circuit for shaping the output of said rectifying integrator and outputting a rectangular pulse, whereby the oscillating pulse outputted from the horizontal oscillating circuit is directly supplied to said high voltage output circuit without going through said delay circuit.

4. A horizontal deflection and high voltage generating circuit as set forth in claim 1, wherein said pulse duration regulating means regulates the pulse duration of the oscillating pulse of said horizontal oscillating circuit so as to initiate conduction of said output transistor of said high voltage output circuit after an end of the high voltage pulse by a time period approximately equal to ¼ of a down period of the high voltage pulse.

5. A horizontal deflection and high voltage generating circuit as set forth in claim 1, wherein said delay circuit comprises a first monostable multivibrator triggered by a leading edge of the oscillating pulse from said horizontal oscillating circuit for outputting a pulse having a pulse duration corresponding to the predetermined delay time and a second monostable multivibrator triggered by a trailing edge of the pulse outputted by said first monostable multivibrator.

6. A horizontal deflection and high voltage generating circuit as set forth in claim 1, wherein said delay circuit comprises a rectifying integrator for integrating the oscillating pulse from said horizontal oscillating circuit and a waveform shaping circuit for shaping the output of said rectifying integrator and outputting a rectangular pulse.

7. A horizontal deflection and high voltage generating circuit having a horizontal oscillating circuit, a horizontal excitation circuit responsive to an oscillating pulse outputted from the horizontal oscillating circuit to operate, a horizontal output circuit to be excited by an output of the horizontal excitation circuit, a high voltage output circuit responsive to an oscillating pulse outputted from the horizontal oscillating circuit to operate, said horizontal deflection and high voltage generating circuit including:
- a first monostable multivibrator triggered by a leading edge of the horizontal oscillating pulse for outputting a pulse having a pulse duration corresponding to a predetermined delay time;
- a second monostable multivibrator triggered by a trailing edge of a pulse outputted by said first monostable multivibrator; and
- an OR circuit for receiving the output pulse of said first monostable multivibrator and an output pulse of said second monostable multivibrator and performing an OR operation of the outputs of said first and second monostable multivibrators, wherein the output pulse of said second monostable multivibrator is applied to said horizontal excitation circuit, and an output of the OR circuit is applied to a high voltage excitation circuit of the high voltage output circuit, wherein a duration of the output pulse of said first monostable multivibrator is set such that a trailing edge of a horizontal deflection pulse generated by said horizontal output circuit is nearly in agreement with a trailing edge of a high voltage pulse produced by said high voltage output circuit, said high voltage pulse having a pulse duration larger than a pulse duration of the horizontal deflection pulse, and wherein a duration of the output pulse of said second monostable multivibrator is set such that condition of an output transistor of said high voltage output circuit initiates after an end of the high voltage pulse by a time period approximately equal to ¼ of a down period of the high voltage pulse.

8. A horizontal deflection and high voltage generating circuit having a horizontal oscillating circuit, a horizontal excitation circuit responsive to an oscillating pulse outputted from the horizontal oscillating circuit to operate, a horizontal output circuit to be excited by an output of the horizontal excitation circuit, a high voltage output circuit responsive to an oscillating pulse outputted from the horizontal oscillating circuit to operate, said horizontal deflection and high voltage generating circuit including:
- a first monostable multivibrator triggered by a leading edge of the horizontal oscillating pulse for outputting a pulse having a pulse duration corresponding to a predetermined delay time; and
- a second monostable multivibrator triggered by a trailing edge of a pulse outputted by said first monostable multivibrator, wherein the value of the pulse duration of the output pulse of said first monostable multivibrator is set to cause that conduction of a horizontal output transistor of said horizontal output circuit initiates after an end of a horizontal deflection pulse generated at a collector of said horizontal output circuit by a time period approximately equal to ¼ of a down period of the horizontal deflection pulse, and further a pulse duration of the oscillating pulse of said horizontal oscillating circuit is set to cause that conduction of an output transistor of said high voltage output circuit initiates after an end of the high voltage pulse by a time period approximately equal to ¼ of a down period of the high voltage pulse portion of the high voltage pulse.

* * * * *